United States Patent
Lee

(10) Patent No.: US 12,211,792 B2
(45) Date of Patent: Jan. 28, 2025

(54) SEMICONDUCTOR MEMORY DEVICE AND METHOD OF MANUFACTURING SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/390,171

(22) Filed: Dec. 20, 2023

(65) Prior Publication Data

US 2024/0162148 A1 May 16, 2024

Related U.S. Application Data

(62) Division of application No. 17/380,632, filed on Jul. 20, 2021, now Pat. No. 11,894,300.

(30) Foreign Application Priority Data

Nov. 12, 2020 (KR) .......................... 10-2020-0150833
Feb. 19, 2021 (KR) .......................... 10-2021-0022705

(51) Int. Cl.
*H01L 23/528* (2006.01)
*H01L 23/00* (2006.01)
*H01L 29/417* (2006.01)
*H10B 43/27* (2023.01)

(52) U.S. Cl.
CPC ............ *H01L 23/528* (2013.01); *H01L 24/80* (2013.01); *H01L 29/41766* (2013.01); *H10B 43/27* (2023.02); *H01L 2224/80895* (2013.01)

(58) Field of Classification Search
CPC . H01L 23/528; H01L 24/80; H01L 29/41766; H01L 2224/80895; H10B 43/27
See application file for complete search history.

(56) References Cited

U.S. PATENT DOCUMENTS 11,640,976 B2    5/2023    Lee

FOREIGN PATENT DOCUMENTS

KR    1020180135643 A    12/2018

*Primary Examiner* — Samuel A Gebremariam
(74) *Attorney, Agent, or Firm* — WILLIAM PARK & ASSOCIATES LTD.

(57) ABSTRACT

Provided herein may be a semiconductor memory device and a method of manufacturing the semiconductor memory device. The semiconductor memory device includes a source structure, a stacked conductive layer that overlaps with the source structure, a first select conductive layer and a second select conductive layer disposed between the source structure and the stacked conductive layer, a stacked insulating layer disposed between the first and second select conductive layers and the stacked conductive layer, and a separation insulating structure provided between the first select conductive layer and the second select conductive layer.

9 Claims, 19 Drawing Sheets

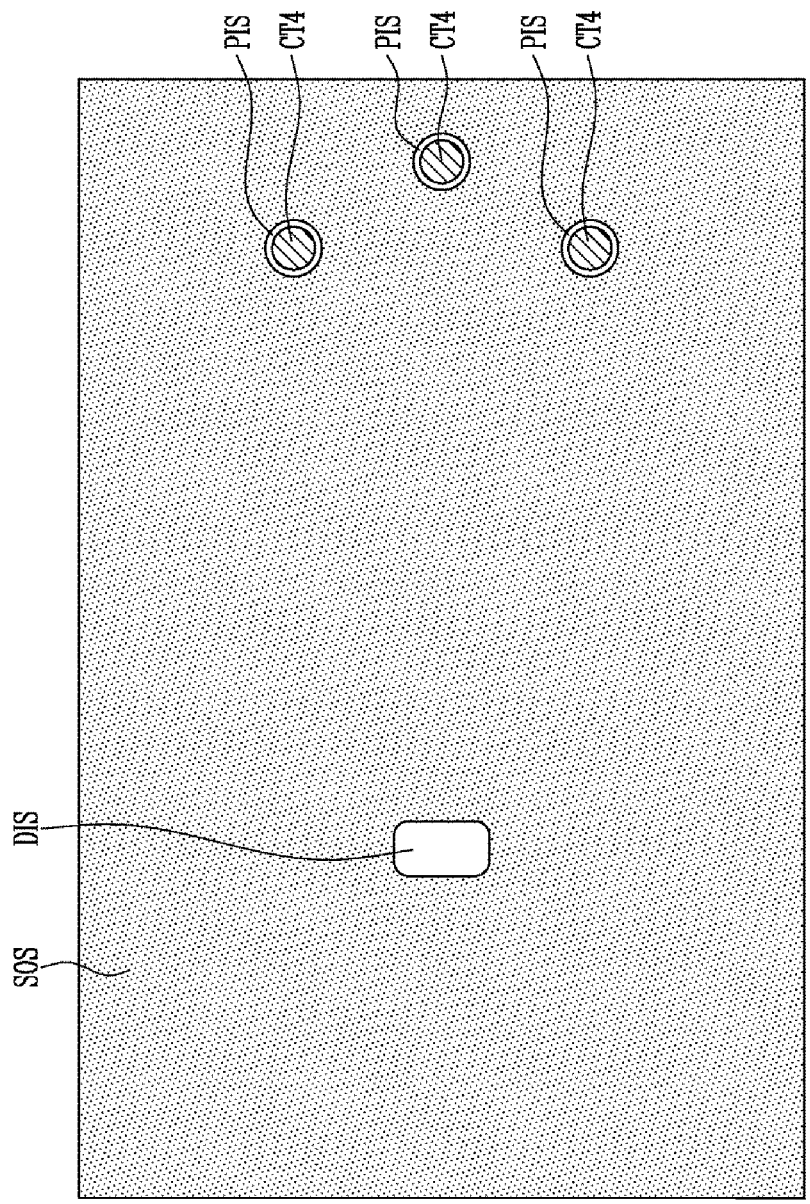
FIG. 2A
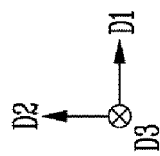

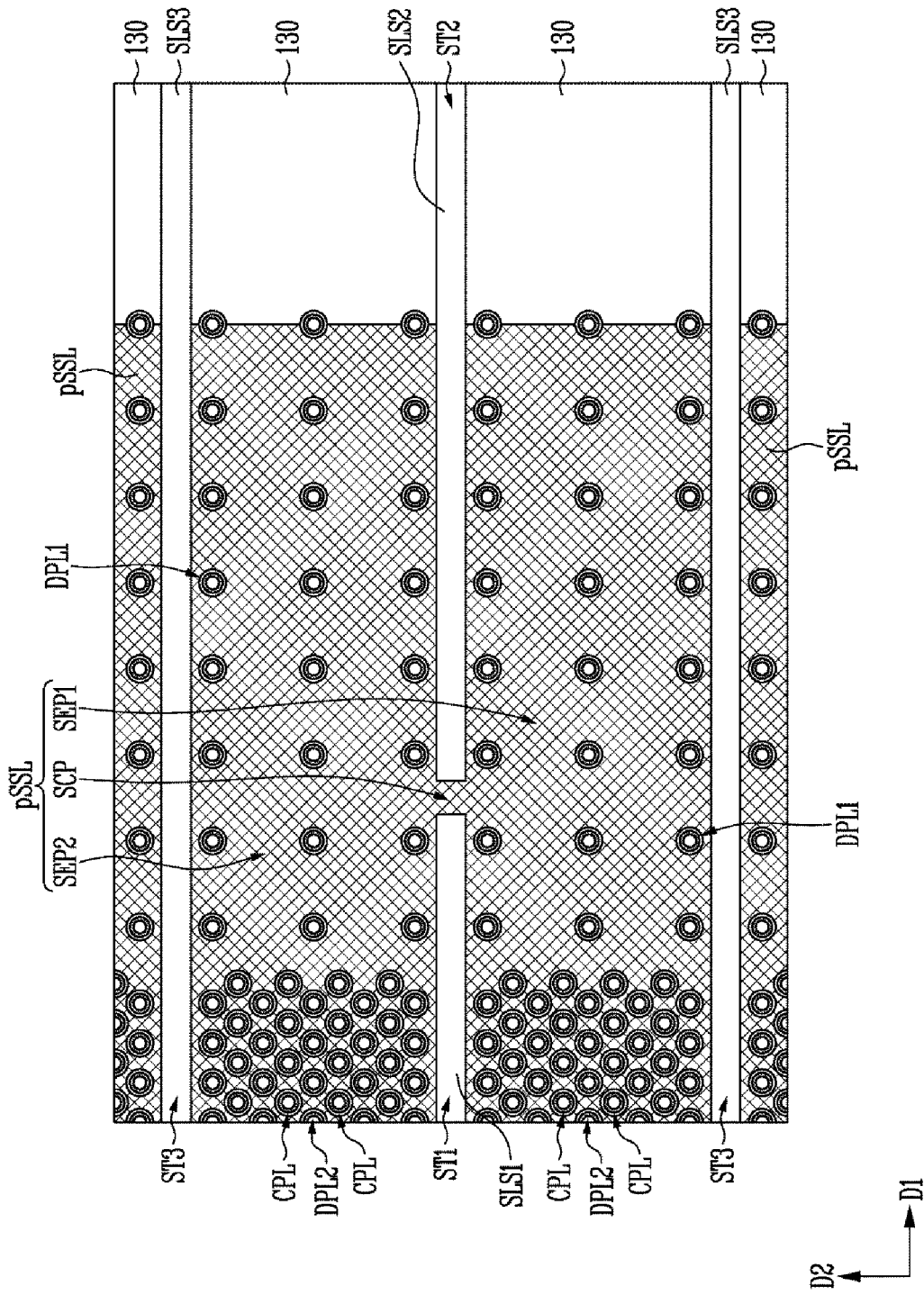

SEMICONDUCTOR MEMORY DEVICE AND METHOD OF MANUFACTURING SEMICONDUCTOR MEMORY DEVICE

CROSS-REFERENCE TO RELATED APPLICATION

The present application is a divisional application of U.S. patent application Ser. No. 17/380,632, filed on Jul. 20, 2021, and claims priority under 35 U.S.C. § 119(a) to Korean patent application number 10-2020-0150833 filed on Nov. 12, 2020 and Korean patent application number 10-2021-0022705 filed on Feb. 19, 2021, in the Korean Intellectual Property Office, the entire disclosure of which is incorporated by reference herein.

BACKGROUND

1. Technical Field

Various embodiments of the present disclosure may relate to a semiconductor memory device and a method of manufacturing the semiconductor memory device, and more particularly to a three-dimensional semiconductor memory device and a method of manufacturing the three-dimensional semiconductor memory device.

2. Related Art

A semiconductor memory device includes memory cells which are configured to store data. A three-dimensional (3D) semiconductor memory device may include memory cells that are arranged in three dimensions, resulting in a reduction in area that is occupied by the memory cells per unit area of a substrate.

In order to improve the degree of integration of the three-dimensional semiconductor memory device, the number of stacked memory cells is increased. As the number of the stacked memory cells increases, the operational reliability of the three-dimensional semiconductor memory device may decrease.

SUMMARY

According to an embodiment of the present disclosure, a semiconductor memory device may include a source structure, a stacked conductive layer overlapping with the source structure, a first select conductive layer and a second select conductive layer disposed between the source structure and the stacked conductive layer, a stacked insulating layer disposed between the first select conductive layer and the stacked conductive layer and between the second select conductive layer and the stacked conductive layer, a first slit structure and a second slit structure passing through the stacked conductive layer and the stacked insulating layer, and a separation insulating structure passing through the source structure, wherein the first and second slit structures and the separation insulating structure may be disposed between the first select conductive layer and the second select conductive layer, and the separation insulating structure may be disposed between the first slit structure and the second slit structure.

According to an embodiment of the present disclosure, a semiconductor memory device may include a source structure, a stacked conductive layer overlapping with the source structure, a first select conductive layer and a second select conductive layer disposed between the source structure and the stacked conductive layer, a stacked insulating layer disposed between the first select conductive layer and the stacked conductive layer and between the second select conductive layer and the stacked conductive layer, and a separation insulating structure that passes through the source structure, wherein the separation insulating structure may be disposed between the first and second select conductive layers, and the stacked conductive layer may include a first conductive extension that overlaps with the first select conductive layer, a second conductive extension that overlaps with the second select conductive layer, and a conductive connector that overlaps with the separation insulating structure.

According to an embodiment of the present disclosure, a semiconductor memory device may include a source structure, a stacked conductive layer overlapping with the source structure, a first select conductive layer and a second select conductive layer disposed between the source structure and the stacked conductive layer, a stacked insulating layer disposed between the first select conductive layer and the stacked conductive layer and between the second select conductive layer and the stacked conductive layer, a first slit structure and a second slit structure that pass through the stacked conductive layer and the stacked insulating layer, and spaced apart from each other in a first direction, and a separation insulating structure disposed between the first and second slit structures, wherein the first and second select conductive layers may be spaced apart from each other due to the first slit structure, the second slit structure, and the separation insulating structure, and a width of the separation insulating structure may be greater than widths of the first and second slit structures.

According to an embodiment of the present disclosure, a method of manufacturing a semiconductor memory device may include forming a source structure with a first surface and a second surface that face in opposite directions, forming a stacked body, including a preliminary select conductive layer, stacked conductive layers, and stacked insulating layers, on the first surface of the source structure, forming cell plugs that pass through the stacked body, the cell plugs being connected to the source structure, forming a separation structure hole that passes through the source structure from the second surface of the source structure, and forming a separation insulating structure in the separation structure hole, wherein forming the separation structure hole may include separating the preliminary select conductive layer into a first select conductive layer and a second select conductive layer.

BRIEF DESCRIPTION OF THE DRAWINGS

FIG. 2A is a plan view of the semiconductor memory device taken along line A-A' of FIG. 1B.

FIGS. 3, 4, 5, 6, 7A, 7B, 8, 9, 10A, 10B, and 11 are diagrams illustrating a method of manufacturing a semiconductor memory device in accordance with an embodiment of the present disclosure.

DETAILED DESCRIPTION

Specific structural and functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

It will be understood that, although the terms "first", "second", etc. may be used herein to describe various elements, these elements are not limited by these terms. These terms are used for distinguishing one element from another element.

Various embodiments of the present disclosure are directed to a semiconductor memory device and a method of manufacturing the semiconductor memory device, which are capable of improving operational reliability.

Figure 1A:
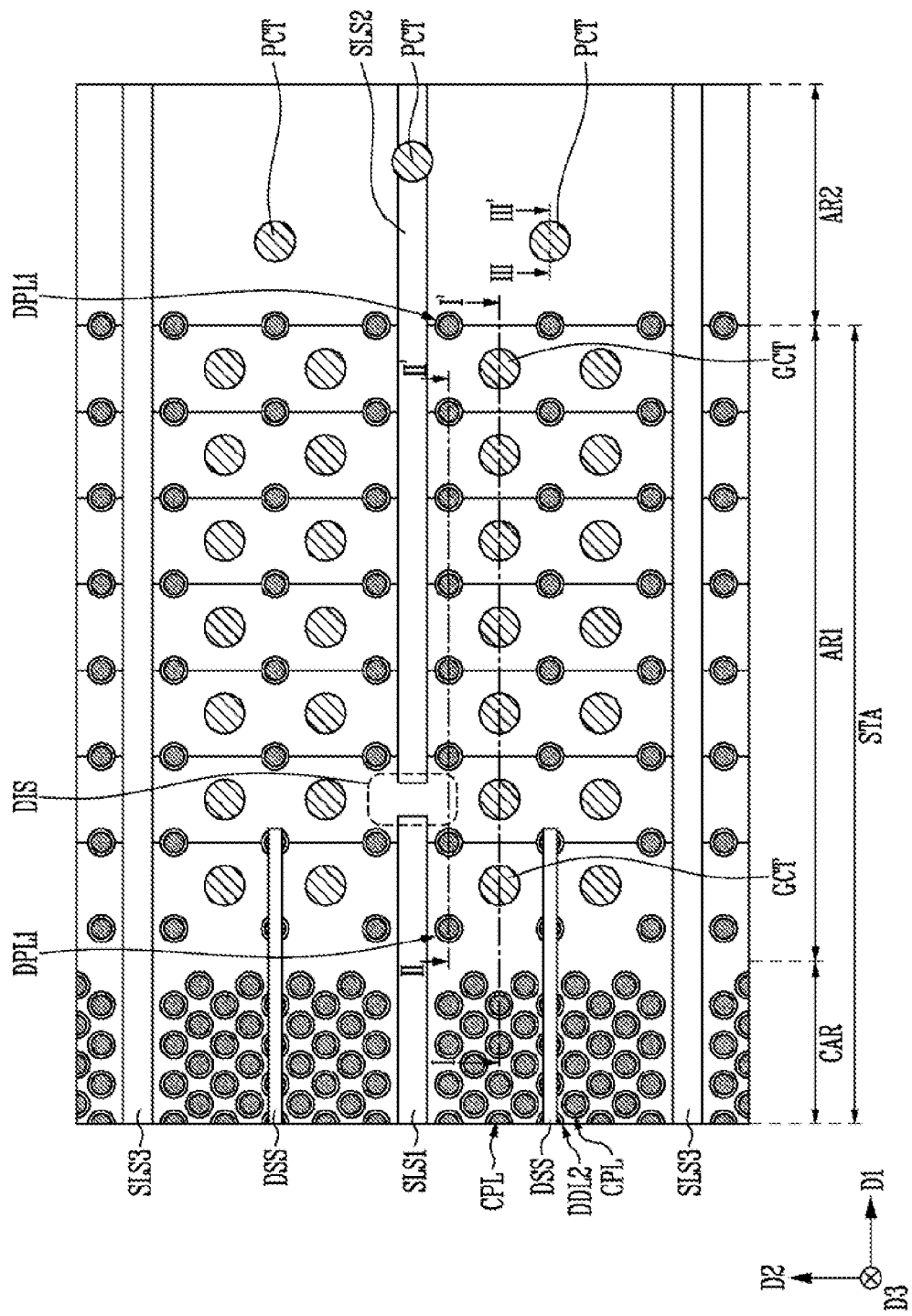
FIG. 1A is a plan view illustrating a semiconductor memory device in accordance with an embodiment of the present disclosure.
Figure 1B:
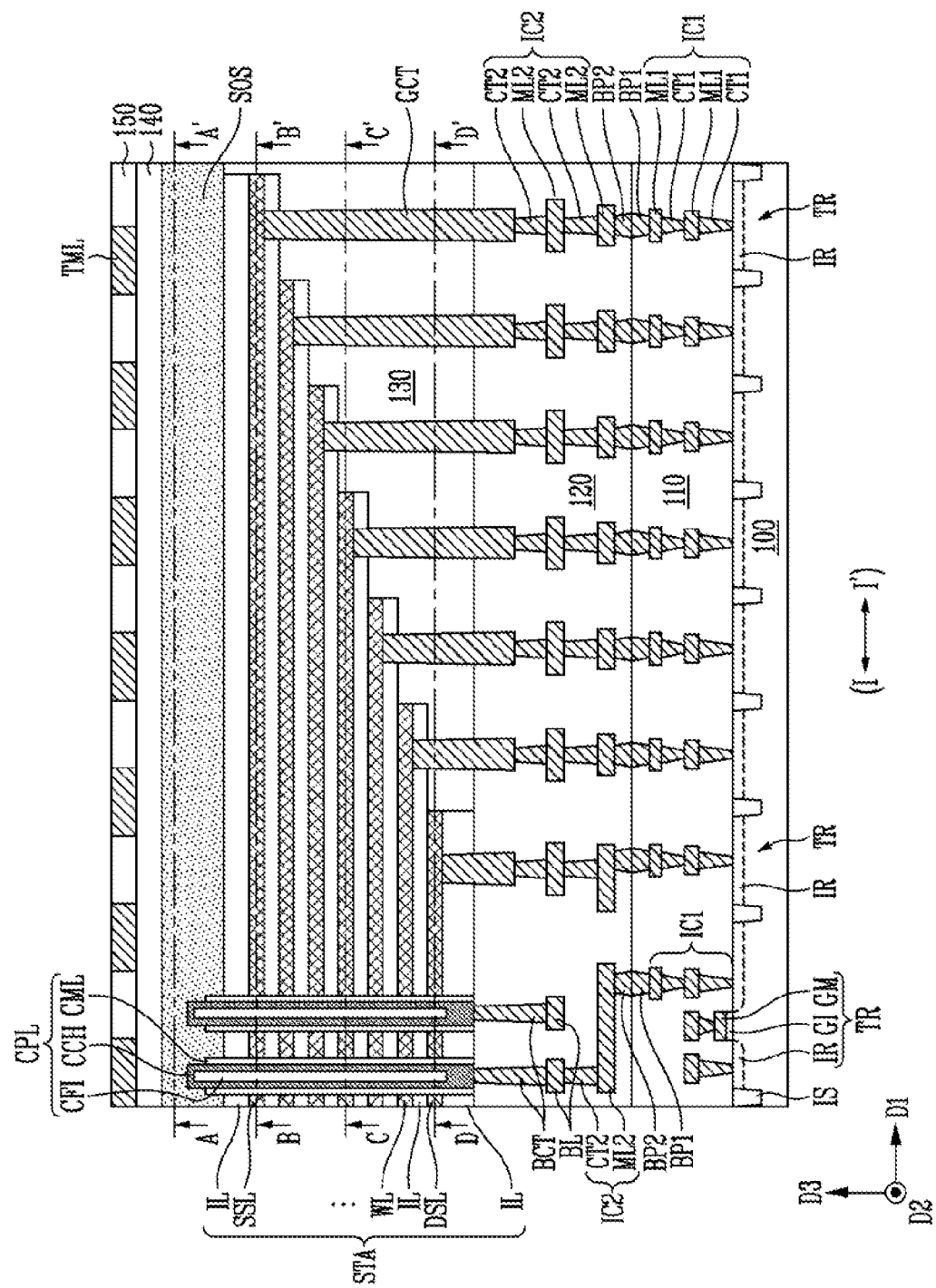
FIG. 1B is a sectional view of the semiconductor memory device taken along line I-I' of FIG. 1A.
Figure 1C:
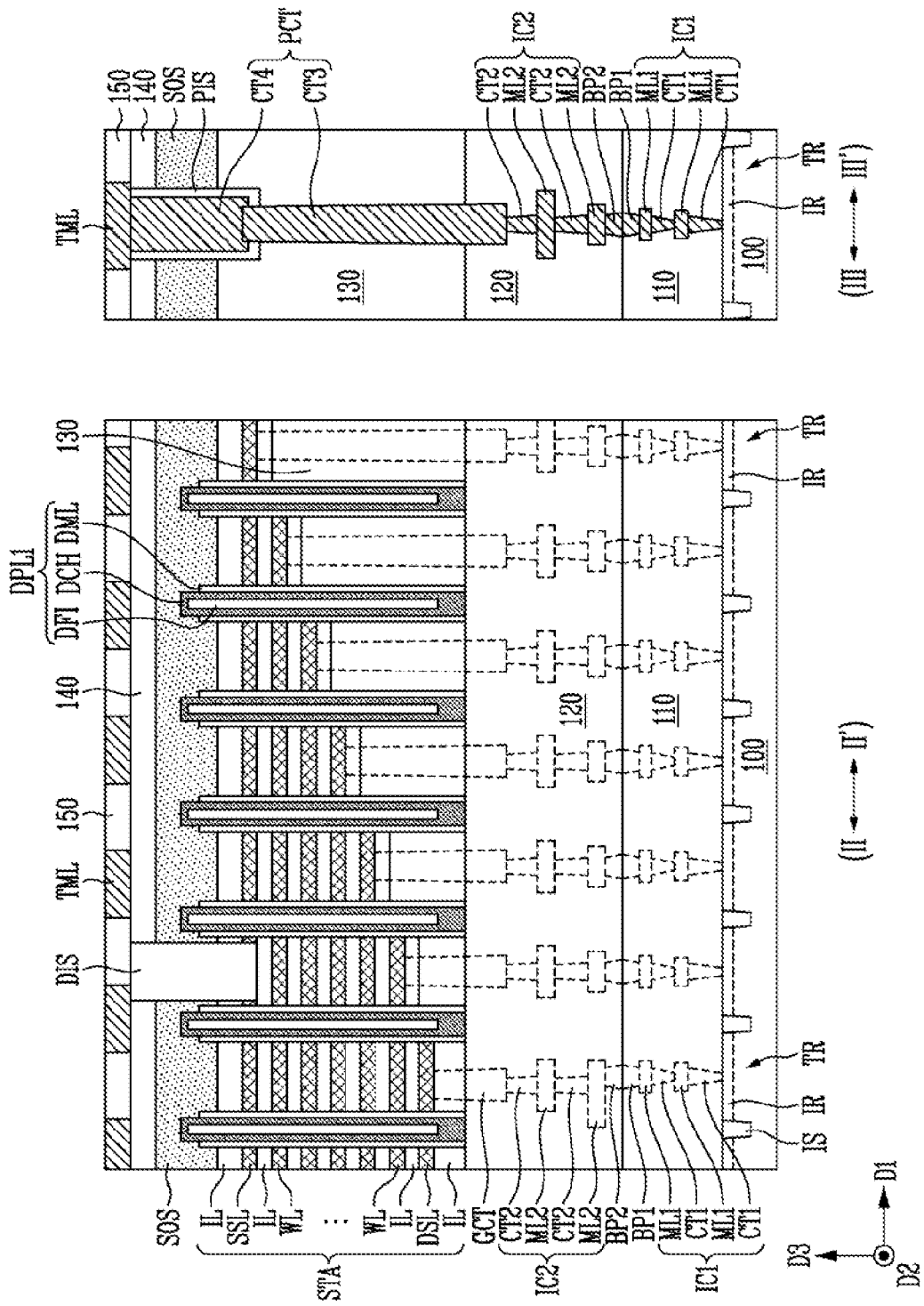
FIG. 1C illustrates sectional views of the semiconductor memory device taken along line II-II' and line III-III' of FIG. 1A.

FIG. 1A is a plan view illustrating a semiconductor memory device in accordance with an embodiment of the present disclosure. FIG. 1B is a sectional view of the semiconductor memory device taken along line I-I' of FIG. 1A. FIG. 1C illustrates sectional views of the semiconductor memory device taken along line II-II' and line III-III' of FIG. 1A. Elements shown by dotted lines in FIG. 1C do not overlap with each other with respect to the lines, but are shown to help understand the arrangement of the elements of the semiconductor memory device.

Referring to FIG. 1A, the semiconductor memory device may include gate stacked bodies STA. Each of the gate stacked bodies STA may extend in a first direction D1 and a second direction D2. The first direction D1 and the second direction D2 may be directions in which axes that intersect with each other extend. In an embodiment, the second direction D2 may be defined as a direction that is perpendicular to the first direction D1.

Each of the gate stacked bodies STA may include a memory cell array area CAR and a first contact area AR1. The first contact area AR1 may extend from the memory cell array area CAR. In an embodiment, the first contact area AR1 may extend from the memory cell array area CAR in the first direction D1. In the first contact area AR1, each of the gate stacked bodies STA may be formed in a stepped structure.

Each of the gate stacked bodies STA may be penetrated by a first slit structure SLS1 and a second slit structure SLS2. The first slit structure SLS1 and the second slit structure SLS2 may extend in a third direction D3. The third direction D3 may be defined as a direction in which an axis that intersects with a plane that is created based on the first direction D1 and the second direction D2 extends. In an embodiment, the third direction D3 may be defined as a direction that is perpendicular to the plane that is created based on the first direction D1 and the second direction D2. The first slit structure SLS1 and the second slit structure SLS2 may be spaced apart from each other. In an embodiment, the first slit structure SLS1 and the second slit structure SLS2 may be spaced apart from each other in the first direction D1. The first slit structure SLS1 and the second slit structure SLS2 may extend in the first direction D1.

Each of the gate stacked bodies STA may overlap with a separation insulating structure DIS that is disposed between the first slit structure SLS1 and the second slit structure SLS2.

Each of the gate stacked bodies STA in the memory cell array area CAR may be penetrated by cell plugs CPL. Each of the gate stacked bodies STA in the first contact area AR1 may be penetrated by first dummy plugs DPL1. Each of the gate stacked bodies STA in the memory cell array area CAR may be penetrated by second dummy plugs DPL2. The embodiment of the present disclosure is not limited thereto, and the second dummy plugs DPL2 may be omitted. The cell plugs CPL, the first dummy plugs DPL1, and the second dummy plugs DPL2 may extend in the third direction D3, and may include the same material layers.

The gate stacked bodies STA may be separated from each other by third slit structures SLS3. Each third slit structure SLS3 may extend in the third direction D3. Each third slit structure SLS3 may include a portion that is parallel to the first slit structure SLS1 and a portion that is parallel to the second slit structure SLS2. In an embodiment, each third slit structure SLS3 may extend in the first direction D1 to be parallel to the first slit structure SLS1. Furthermore, each third slit structure SLS3 may extend farther than the first slit structure SLS1 in the first direction D1 to be parallel to the second slit structure SLS2.

Each of the gate stacked bodies STA may include layers that are penetrated by a drain separation insulating structure DSS and layers that overlap with the drain separation insulating structure DSS. The drain separation insulating structure DSS may be disposed between the first slit structure SLS1 and the third slit structure SLS3 that are adjacent to each other. The drain separation insulating structure DSS may be formed to be shorter in the third direction D3 than each of the first slit structure SLS1, the second slit structure SLS2, and the third slit structures SLS3.

The cell plugs CPL may pass through the gate stacked bodies STA at both sides of the drain separation insulating structure DSS. The second dummy plugs DPL2 may be arranged in a line along the extending direction of the drain separation insulating structure DSS. The drain separation insulating structure DSS may overlap with the second dummy plugs DPL2.

The semiconductor memory device may include gate contacts GCT that overlap with the gate stacked bodies STA in the first contact area AR1.

The semiconductor memory device may further include penetration contacts PCT. Hereinafter, for convenience of explanation, an area in which the penetration contacts PCT are disposed is defined as a second contact area AR2. The second contact area AR2 may be an open area that is not covered with the gate stacked bodies STA.

Referring to FIGS. 1B and 1C, the semiconductor memory device may include a substrate 100, transistors TR, a first insulating layer 110, first interconnections IC1, and first bonding pads BP1.

The substrate 100 may have the shape of a plate that extends in the first direction D1 and the second direction D2. In an embodiment, the substrate 100 may be a semiconductor substrate.

The first insulating layer 110 may cover the substrate 100. The first insulating layer 110 may include an insulating material. In an embodiment, the first insulating layer 110 may include oxide or nitride. The first insulating layer 110 may be a multilayer structure.

The transistors TR may be disposed between the first insulating layer 110 and the substrate 100. The transistors TR may form a peripheral circuit of the semiconductor memory device.

Each of the transistors TR may include impurity areas IR, a gate insulating layer GI, and a gate electrode GM. The impurity areas IR may be defined by doping active areas of the substrate 100 with a conductivity impurity. The gate electrode GM may be spaced apart from the substrate 100 due to the gate insulating layer GI. The gate insulating layer GI may include an insulating material. In an embodiment, the gate insulating layer GI may include oxide. The gate electrode GM may include a conductive material. In an embodiment, the gate electrode GM may include tungsten.

The active areas of the substrate 100 may be partitioned by isolation layers IS. The isolation layers IS may be formed in the substrate 100. The transistors TR may be insulated from each other due to the isolation layers IS. The isolation layers IS may include an insulating material. In an embodiment, the isolation layers IS may include oxide.

The first interconnections IC1 may be formed in the first insulating layer 110. The first interconnections IC1 may be disposed between the first bonding pads BP1 and the transistors TR. The first bonding pads BP1 and the transistors TR may be electrically connected through the first interconnections IC1. The first interconnections IC1 may include first contacts CT1 and first lines ML1. The structure and arrangement of the first contacts CT1 and the first lines ML1 may be varied. The first contacts CT1 and the first lines ML1 may include a conductive material. In an embodiment, the first contacts CT1 and the first lines ML1 may include tungsten.

The first bonding pads BP1 may be disposed in the first insulating layer 110. The width of each first bonding pad BP1 may be reduced as the first bonding pad comes closer to the substrate 100. In an embodiment, the width of the first bonding pad BP1 in the first direction D1 may be reduced as the first bonding pad comes closer to the substrate 100. The first bonding pad BP1 may include a conductive material. In an embodiment, the first bonding pad BP1 may include copper.

The gate stacked body STA may overlap with the first insulating layer 110. A second insulating layer 120 may be disposed between the gate stacked body STA and the first insulating layer 110. The second insulating layer 120 may include an insulating material. In an embodiment, the second insulating layer 120 may include oxide or nitride. The second insulating layer 120 may be a multilayer structure.

Second bonding pads BP2 and second interconnections IC2 may be embedded in the second insulating layer 120.

The second bonding pads BP2 may be coupled to the first bonding pads BP1, respectively. The width of each second bonding pad BP2 may be increased as it comes closer to the first bonding pad BP1. In an embodiment, the width of the second bonding pad BP2 in the first direction D1 may be increased as it comes closer to the first bonding pad BP1. The width of the first bonding pad BP1 may be increased as it comes closer to the second bonding pad BP2. In an embodiment, the width of the first bonding pad BP1 in the first direction D1 may be increased as it comes closer to the second bonding pad BP2. The second bonding pad BP2 may include a conductive material. In an embodiment, the second bonding pad BP2 may include copper.

The second interconnections IC2 may be disposed between some of the second bonding pads BP2 and the gate stacked body STA, and between some of the second bonding pads BP2 and the penetration contact PCT. The second interconnections IC2 may be connected to the second bonding patterns BP2, respectively. The second interconnections IC2 may include second contacts CT2 and second lines ML2. The structure and arrangement of the second contacts CT2 and the second lines ML2 may be varied. The second contacts CT2 and the second lines ML2 may include conductive material. In an embodiment, the second contacts CT2 and the second lines ML2 may include tungsten.

The semiconductor memory device may include bit lines BL and bit line contacts BCT. The bit lines BL and the bit line contacts BCT may be disposed in the second insulating layer 120. The bit lines BL and the bit line contacts BCT may be disposed between the gate stacked body STA and the second interconnections IC2. The cell plugs CPL may be spaced apart from the bit lines BL in the third direction D3. The bit line contacts BCT may electrically couple the cell plugs CPL to the bit lines BL. The structure and arrangement of the bit lines BL and the bit line contacts BCT may be varied. The bit lines BL and the bit line contacts BCT may include conductive material. In an embodiment, the bit lines BL and the bit line contacts BCT may include tungsten.

The gate stacked body STA may be disposed on the second insulating layer 120. The semiconductor memory device may include a third insulating layer 130 between the stepped structure of the gate stacked body STA and the second insulating layer 120. Furthermore, the semiconductor memory device may include a source structure SOS that overlaps with the gate stacked body STA and the third insulating layer 130.

The gate stacked body STA may include stacked conductive layers DSL and WL, stacked insulating layers IL, and select conductive layers SSL. The stacked conductive layers DSL and WL may be spaced apart from each other in the third direction D3. Each of the select conductive layers SSL may overlap with the stacked conductive layers DSL and WL. The stacked insulating layers IL may be disposed between the stacked conductive layers DSL and WL that are adjacent to each other in the third direction D3, between the stacked conductive layers DSL and WL and the select conductive layers SSL, and between the select conductive layers SSL and the source structure SOS. The stacked insulating layers IL may be disposed alternately with the stacked conductive layers DSL and WL in the third direction D3.

The stacked conductive layers DSL and WL may include a word line WL and a drain select line DSL. In an embodiment, at least one layer that is adjacent to the bit line BL among the stacked conductive layers DSL and WL may be the drain select line DSL, and the other may be the word line WL. The select conductive layers SSL may be source select lines. Each of the select conductive layers SSL and the stacked conductive layers DSL and WL may include conductive material. In an embodiment, each of the select conductive layers SSL and the stacked conductive layers DSL and WL may include tungsten. The stacked insulating layers IL may include insulating material. For example, the stacked insulating layers IL may include oxide.

As the select conductive layers SSL and the stacked conductive layers DSL and WL extend to different lengths according to a separation distance from the substrate 100, the stepped structure of the gate stacked body STA may be defined. In an embodiment, the select conductive layers SSL and the stacked conductive layers DSL and WL may extend long in the first direction D1 as a distance from the substrate 100 increases. To be more specific, the select conductive layers SSL may extend farther in the first direction D1 than the stacked conductive layers DSL and SL. The stacked insulating layers IL may also extend to different lengths according to a distance from the substrate 100, thus defining a stepped structure.

The third insulating layer 130 may include a stepped surface that corresponds to the stepped structure of the gate stacked body STA. The third insulating layer 130 may be disposed between the second insulating layer 120 and the stepped structure that is formed by the select conductive layers SSL, the stacked conductive layers DSL and WL, and the stacked insulating layers IL. The third insulating layer 130 may include an insulating material. In an embodiment, the third insulating layer 130 may include oxide or nitride.

The gate contacts GCT may pass through the third insulating layer 130. The gate contacts GCT may extend into the second insulating layer 120 to be connected to some of the second interconnections IC2. The gate contacts GCT may pass through at least one stacked insulating layer IL to be connected to the stacked conductive layers DSL and WL and the select conductive layers SSL, respectively. The gate contacts GCT may include conductive material. In an embodiment, the gate contacts GCT may include tungsten.

The bit lines BL and the gate contacts GCT may be electrically coupled to the transistors TR of the peripheral circuit via the second interconnections IC2, the second bonding pads BP2, the first bonding pads BP1, and the first interconnections IC1. In an embodiment, the transistors TR may include transistors of a page buffer and transistors of an X-decoder.

The select conductive layers SSL and the stacked conductive layers DSL and WL may be electrically coupled to the transistors TR constituting the X-decoder via the gate contacts GCT. The transistors TR of the X-decoder may be configured to transmit operating voltages to the select conductive layers SSL and the stacked conductive layers DSL and WL.

Each of the cell plugs CPL may include a cell filling layer CFI, a cell channel layer CCH that encloses the cell filling layer CFI, and a cell memory layer CML configured to enclose the cell channel layer CCH.

The cell filling layer CFI may include an insulating material. In an embodiment, the cell filling layer CFI may include oxide. The cell channel layer CCH may include a semiconductor material. In an embodiment, the cell channel layer CCH may include polysilicon. The cell memory layer CML may include a tunnel insulating layer enclosing the cell channel layer CCH, a data storage layer enclosing the tunnel insulating layer, and a blocking layer enclosing the data storage layer. The tunnel insulating layer may include a material making charge tunneling possible. In an embodiment, the tunnel insulating layer may include oxide. The data storage layer may include a material that is capable of trapping charges. In an embodiment, the data storage layer may include nitride. In addition, the data storage layer may include various materials according to the data storage method. In an embodiment, the data storage layer may include silicon, phase-change material, or nanodots. The blocking layer may include an insulating material that may block the movement of charges. For example, the blocking layer may include oxide.

The first dummy plug DPL1 may include a dummy filling layer DFI, a dummy channel layer DCH enclosing the dummy filling layer DFI, and a dummy memory layer DML enclosing the dummy channel layer DCH.

The dummy filling layer DFI may include an insulating material. The dummy filling layer DFI may include the same material as the cell filling layer CFI. In an embodiment, the dummy filling layer DFI may include oxide. The dummy channel layer DCH may include a semiconductor material. The dummy channel layer DCH may include the same material as the cell channel layer CCH. In an embodiment, the dummy channel layer DCH may include polysilicon. The dummy memory layer DML may include a tunnel insulating layer enclosing the dummy channel layer DCH, a data storage layer enclosing the tunnel insulating layer, and a blocking layer enclosing the data storage layer. The tunnel insulating layer, the data storage layer, and the blocking layer of the dummy memory layer DML may be made of the same materials as the tunnel insulating layer, the data storage layer, and the blocking layer of the cell memory layer CML.

The cell channel layer CCH of the cell plug CPL may be electrically coupled to the bit line BL via the bit line contact BCT. The bit line BL may be electrically coupled to the transistor TR of the page buffer via the second interconnection IC2, the second bonding pad BP2, the first bonding pad BP1, and the first interconnection IC1. The page buffer may temporarily store data received through the bit line BL or to sense the voltage or current of the bit line BL.

The first dummy plug DPL1 may serve to support the gate stacked body STA.

The source structure SOS may have the shape of a plate that extends in the first direction D1 and the second direction D2. The source structure SOS may overlap with the stacked conductive layers DSL and WL. The select conductive layers SSL may be disposed between the stacked conductive layers DSL and WL and the source structure SOS. The source structure SOS may be spaced farther from the substrate 100 than the stacked conductive layers DSL and WL and the select conductive layers SSL. The select conductive layers SSL may be spaced farther from the substrate 100 than the stacked conductive layers DSL and WL.

The source structure SOS may be coupled to the cell channel layers CCH of the cell plugs CPL and the dummy channel layers DCH of the first dummy plugs DPL1.

The source structure SOS may be used as a source line of the semiconductor memory device. In an embodiment, the source structure SOS may include doped polysilicon. In an embodiment, the source structure SOS may be single crystal silicon with areas that are doped with impurities.

The source structure SOS may be covered with a fourth insulating layer 140. The fourth insulating layer 140 may include an insulating material. In an embodiment, the fourth insulating layer 140 may include oxide or nitride.

The fourth insulating layer 140 may be covered with a fifth insulating layer 150. The fifth insulating layer 150 may include an insulating material. In an embodiment, the fifth insulating layer 150 may include oxide or nitride.

The fifth insulating layer 150 may be penetrated by top lines TML. The top lines TML may include conductive material. In an embodiment, the top lines TML may include aluminum.

The separation insulating structure DIS may pass through the fourth insulating layer 140 and the source structure SOS. The separation insulating structure DIS may be enclosed by the source structure SOS. The separation insulating structure DIS may be in contact with the stacked insulating layer IL between the source structure SOS and the select conductive layers SSL. The separation insulating structure DIS may include an insulating material. In an embodiment, the separation insulating structure DIS may include oxide.

The fourth insulating layer 140 and the source structure SOS may be penetrated by a penetration insulating structure PIS and the penetration contact PCT. The penetration insulating structure PIS may be enclosed by the source structure SOS. The penetration insulating structure PIS may be in contact with the third insulating layer 130. The penetration insulating structure PIS may be disposed at substantially the same level as the separation insulating structure DIS. The penetration insulating structure PIS may include an insulating material. In an embodiment, the penetration insulating structure PIS may include oxide.

The penetration contact PCT may include a third contact CT3 defined as a first penetration contact and a fourth contact CT4 defined as a second penetration contact.

The third contact CT3 may be disposed between the second interconnection IC2 and the fourth contact CT4. The third contact CT3 may be in contact with the second interconnection IC2, and may extend towards the fourth contact CT4 in the third direction D3. The third contact CT3 may pass through a portion of the second insulating layer 120 and the third insulating layer 130. The third contact CT3 may include a conductive material. In an embodiment, the third contact CT3 may include tungsten.

The fourth contact CT4 may pass through the source structure SOS. The fourth contact CT4 may be insulated from the source structure SOS due to the penetration insulating structure PIS. The fourth contact CT4 may be coupled to the top line TML. The fourth contact CT4 may include a conductive material. In an embodiment, the fourth contact CT4 may include tungsten.

Some of the top lines TML may be electrically coupled to some of the transistors TR of the peripheral circuit via the penetration contact PCT, the second interconnection IC2, the second bonding pad BP2, the first bonding pad BP1, and the first interconnection IC1.

Hereinafter, the layout of the source structure SOS, the select conductive layers SSL, the word lines WL, and the drain select lines DSL of the semiconductor memory device in accordance with an embodiment of the present invention will be described with reference to FIGS. 2A to 2C.

FIG. 2A is a plan view of the semiconductor memory device taken along line A-A' of FIG. 1B.

Referring to FIG. 2A, the source structure SOS may have the shape of a plate that extends in the first direction D1 and the second direction D2. The source structure SOS may enclose the separation insulating structure DIS. The source structure SOS may enclose the penetration insulating structure PIS. The penetration insulating structure PIS may enclose the fourth contact CT4, and the source structure SOS may enclose the fourth contact CT4 with the penetration insulating structure PIS interposed therebetween.

The separation insulating structure DIS, the fourth contact CT4, and the penetration insulating structure PIS may extend in the third direction D3.

Figure 2B:
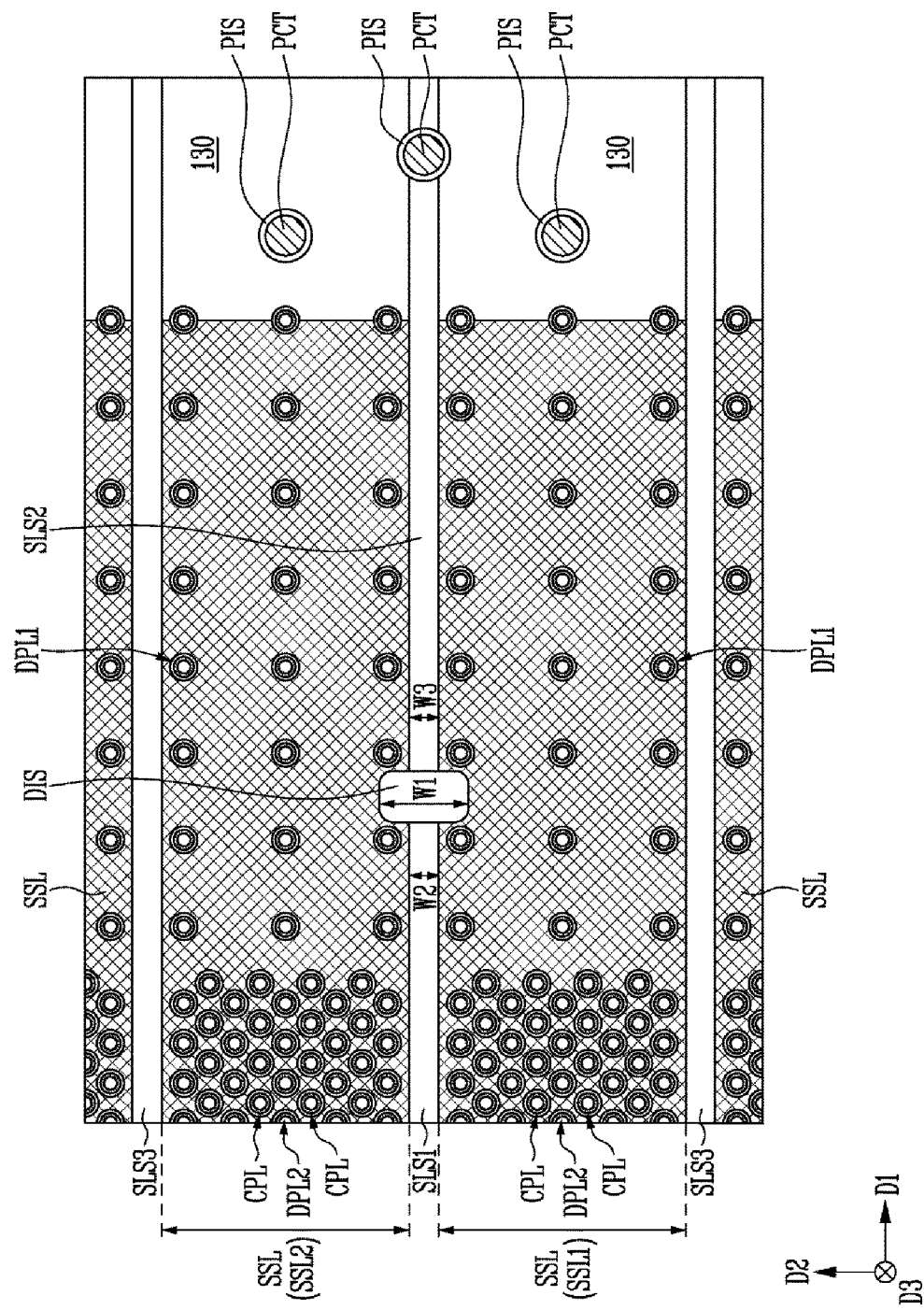
FIG. 2B is a plan view of the semiconductor memory device taken along line B-B' of FIG. 1B.

FIG. 2B is a plan view of the semiconductor memory device taken along line B-B' of FIG. 1B.

Referring to FIG. 2B, the select conductive layers SSL may be insulated from each other due to the first slit structure SLS1, the second slit structure SLS2, and the third slit structures SLS3. The select conductive layers SSL may be arranged at substantially the same level. The select conductive layers SSL may overlap with the source structure SOS shown in FIG. 2A. Each of the select conductive layers SSL may be penetrated by a plurality of cell plugs CPL. Each of the select conductive layers SSL may be penetrated by first dummy plugs DPL1. Each of the select conductive layers SSL may be penetrated by second dummy plugs DPL2. Each of the select conductive layers SSL may have a sidewall that extends along the third insulating layer 130.

The select conductive layers SSL may include a first select conductive layer SSL1 and a second select conductive layer SSL2 between the third slit structures SLS3. The first select conductive layer SSL1 and the second select conductive layer SSL2 may be spaced apart from each other in the second direction D2. The first select conductive layer SSL1 and the second select conductive layer SSL2 may be arranged at substantially the same level. The first select conductive layer SSL1 might not only be spaced apart from the second select conductive layer SSL2, but also be insulated from the second select conductive layer SSL2 due to the first slit structure SLS1, the second slit structure SLS2, and the separation insulating structure DIS.

The third slit structures SLS3 may be spaced apart from each other in the second direction D2. The first slit structure SLS1, the second slit structure SLS2, and the separation insulating structure DIS may be disposed between the third slit structures SLS3. The first slit structure SLS1, the second slit structure SLS2, and the separation insulating structure DIS may be disposed between the first select conductive layer SSL1 and the second select conductive layer SSL2.

The first to third slit structures SLS1, SLS2, and SLS3 may be covered with the source structure SOS shown in FIG. 2A. The first to third slit structures SLS1, SLS2, and SLS3 may include insulating material. In an embodiment, the first to third slit structures SLS1, SLS2, and SLS3 may include oxide.

The separation insulating structure DIS may be disposed between the first slit structure SLS1 and the second slit structure SLS2 that are spaced apart from each other in the first direction D1. The separation insulating structure DIS may include a side coupled to the first slit structure SLS1, and a side coupled to the second slit structure SLS2.

The width of the separation insulating structure DIS may be greater than the widths of the first and second slit structures SLS1 and SLS2. In an embodiment, if the width of the separation insulating structure DIS in the second direction D2 is defined as a first width W1, the width of the first slit structure SLS1 in the second direction D2 is defined as a second width W2, and the width of the second slit structure SLS2 in the second direction D2 is defined as a third width W3, the first width W1 may be greater than the second width W2 and the third width W3.

The third insulating layer 130 may be covered with the source structure SOS shown in FIG. 2A. The second slit structure SLS2 may be coupled to the third insulating layer 130. The second slit structure SLS2 may extend from the separation insulating structure DIS in the first direction D1, and may pass through the third insulating layer 130.

The penetration contact PCT and the penetration insulating structure PIS may extend to pass through a portion of the third insulating layer 130. Either of the third contact CT3 and the fourth contact CT4 of the penetration contact PCT illustrated in FIG. 1C may be disposed at the same level as the select conductive layers SSL, or a portion of the third contact CT3 and a portion of the fourth contact CT4 may extend to a level at which the select conductive layers SSL are disposed.

Figure 2C:
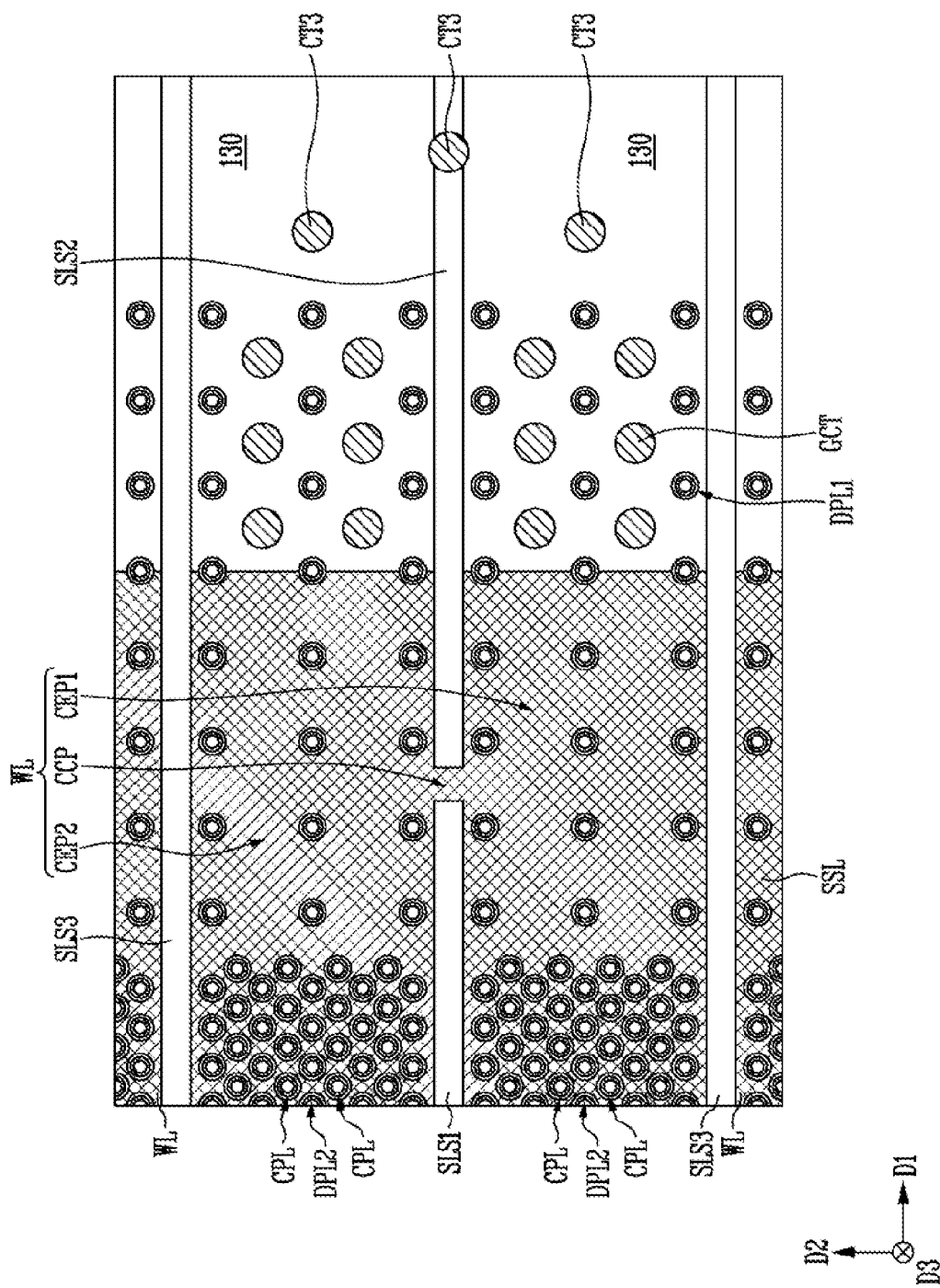
FIG. 2C is a plan view of the semiconductor memory device taken along line C-C' of FIG. 1B.
Figure 2D:
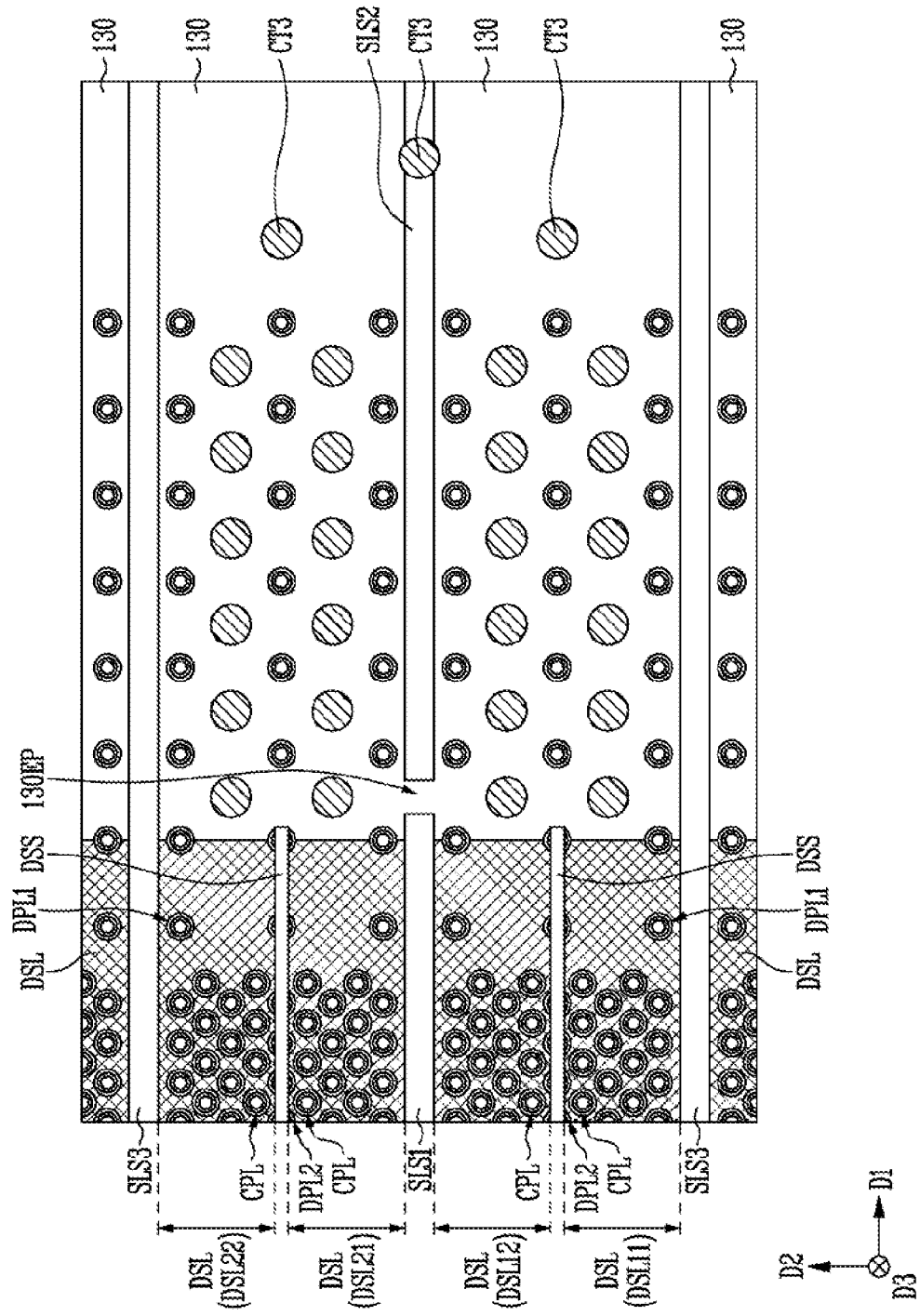
FIG. 2D is a plan view of the semiconductor memory device taken along line D-D' of FIG. 1B.

FIG. 2C is a plan view of the semiconductor memory device taken along line C-C' of FIG. 1B. FIG. 2D is a plan view of the semiconductor memory device taken along line D-D' of FIG. 1B.

Referring to FIGS. 2C and 2D, each of the first slit structure SLS1, the second slit structure SLS2, the cell plugs CPL, the first dummy plugs DPL1, and the second dummy plugs DPL2 may extend in the third direction D3 to pass through the stacked conductive layers WL and DSL. Each of the stacked conductive layers WL and DSL may have a sidewall that extends along the third insulating layer 130. The third insulating layer 130 may be penetrated by the gate contacts GCT.

Referring to FIG. 2C, each of the word lines WL of the stacked conductive layers WL and DSL may include a first conductive extension CEP1, a second conductive extension CEP2, and a conductive connector CCP. The first conductive extension CEP1, the second conductive extension CEP2, and the conductive connector CCP may be disposed between the third slit structures SLS3 that are adjacent to each other in the second direction D2.

Each of the first conductive extension CEP1 and the second conductive extension CEP2 may have the shape of a plate that extends in the first direction D1 and the second direction D2. The first conductive extension CEP1 may overlap with the first select conductive layer SSL1, illustrated in FIG. 2B, in the third direction D3. The second conductive extension CEP2 may overlap with the second select conductive layer SSL2, illustrated in FIG. 2B, in the third direction D3. The first slit structure SLS1 and the second slit structure SLS2 may be disposed between the first conductive extension CEP1 and the second conductive extension CEP2. In other words, the first conductive extension CEP1 and the second conductive extension CEP2 may be spaced apart from each other in the second direction D2 due to the first slit structure SLS1 and the second slit structure SLS2. The first conductive extension CEP1 and the second conductive extension CEP2 may be electrically coupled to each other through the conductive connector CCP.

The conductive connector CCP may overlap with the separation insulating structure DIS shown in FIG. 2B, in the third direction D3. The conductive connector CCP may be disposed between the first slit structure SLS1 and the second slit structure SLS2. The conductive connector CCP may extend from the first conductive extension CEP1 towards the second extension CEP2 in the second direction D2.

Each word line WL may be formed shorter in the first direction D1 than the select conductive layers SSL illustrated in FIG. 2B. Each word line WL may have a sidewall that extends along the third insulating layer 130. The third insulating layer 130 may extend to overlap with an end of each of the select conductive layers SSL shown in FIG. 2B. At a level where each word line WL is disposed, the third insulating layer 130 may enclose some of the first dummy plugs DPL1 adjacent to the third contact CT3.

Referring to FIG. 2D, the drain select lines DSL of the stacked conductive layers WL and DSL may be disposed on substantially the same level. The drain select lines DSL might not only be spaced apart from each other but also be insulated from each other due to the first slit structure SLS1, the third slit structures SLS3, and the drain separation insulating structure DSS.

The drain separation insulating structure DSS may overlap with the second dummy plugs DPL2 that are arranged in a line in the first direction D1, and may overlap with some of the first dummy plugs DPL1. The drain separation insulating structure DSS may separate the conductive layer between the first slit structure SLS1 and the third slit structure SLS3, which are adjacent to each other in the second direction D2, into two or more drain select lines DSL. In an embodiment, the drain select lines DSL may include a first group of first drain select lines DSL11, a first group of second drain select lines DSL12, a second group of first drain select lines DSL21, and a second group of second drain select lines DSL22, which are disposed between adjacent third slit structures SLS3.

The first group of first drain select lines DSL11 and the first group of second drain select lines DSL12 may be disposed between the first slit structure SLS1 and one third slit structure SLS3 adjacent thereto. The first group of first drain select lines DSL11 might not only be spaced apart from the first group of second drain select lines DSL12, but also be insulated from the first group of second drain select lines DSL12 due to the drain separation insulating structure DSS. The first group of first drain select lines DSL11, the first group of second drain select lines DSL12, and the drain separation insulating structure DSS between the first group of first drain select lines DSL11 and the first group of second drain select lines DSL12 may overlap with the first conductive extension CEP1 shown in FIG. 2C.

The second group of first drain select lines DSL21 and the second group of second drain select lines DSL22 may be disposed between the first slit structure SLS1 and another third slit structure SLS3 adjacent thereto. The second group of first drain select lines DSL21 might not only be spaced apart from the second group of second drain select lines DSL22, but also be insulated from the second group of second drain select lines DSL22 due to the drain separation insulating structure DSS. The second group of first drain select lines DSL21, the second group of second drain select lines DSL22, and the drain separation insulating structure DSS between the second group of first drain select lines DSL21 and the second group of second drain select lines DSL22 may overlap with the second conductive extension CEP2 shown in FIG. 2C.

Each drain separation insulating structure DSS may extend farther than the drain select lines DSL. In an embodiment, each drain separation insulating structure DSS may extend farther than the drain select lines DSL in the first direction D1.

The first slit structure SLS1 may extend longer than each of the drain select lines DSL. In an embodiment, the first slit structure SLS1 may extend farther than each of the drain select lines DSL in the first direction D1.

Each of the drain select lines DSL may be formed to be shorter in the first direction D1 than the word line WL illustrated in FIG. 2C. Each of the drain select lines DSL may have a sidewall that extends along the third insulating layer 130. The third insulating layer 130 may extend to overlap with an end of the word line WL shown in FIG. 2C. The third insulating layer 130 may include an extension 130EP that extends between the first slit structure SLS1 and the second slit structure SLS2. The extension 130EP may be disposed at a level where the drain select lines DSL are disposed, and may overlap with the conductive connector CCP illustrated in FIG. 2C.

In the above-described embodiment of the present disclosure, the separation insulating structure DIS that passes through the source structure SOS as illustrated in FIG. 1C may extend to a level where the select conductive layers SSL are disposed. Thus, as illustrated in FIG. 2B, the first select conductive layer SSL1 and the second select conductive layer SSL2 may be separated from each other due to the separation insulating structure DIS. As illustrated in FIG. 1C, the select conductive layers SSL are disposed between the stacked conductive layers WL and DSL and the source structure SOS. The first select conductive layer SSL1 and the second select conductive layer SSL2 may be on the same plane that is created based on the first direction D1 and the second direction D2. According to an embodiment of the present disclosure, the depth of the separation insulating structure DIS may be controlled so that it does not pass through the stacked conductive layers WL and DSL, thus allowing the select conductive layers SSL to be separated from the stacked conductive layers WL and DSL as a different unit.

Hereinafter, a method of manufacturing a semiconductor memory device in accordance with an embodiment of the present disclosure will be described.

FIGS. 3, 4, 5, 6, 7A, 7B, 8, 9, 10A, 10B, and 11 are diagrams illustrating a method of manufacturing a semiconductor memory device in accordance with an embodiment of the present disclosure. Herein below, repetitive explanation will be omitted if deemed redundant. Hereinafter, sectional views mainly show the structure shown in FIG. 1C.

Figure 3:
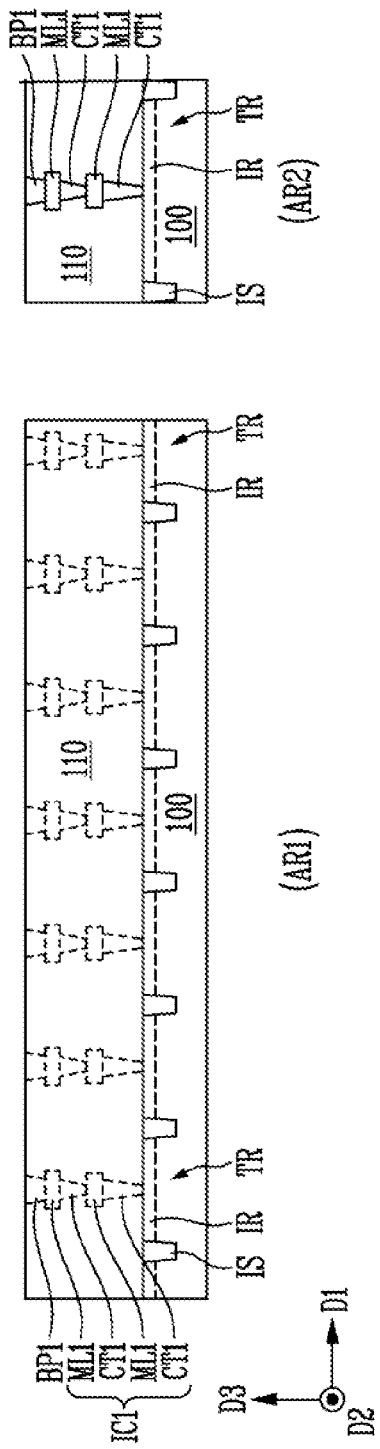

FIG. 3 illustrates sectional views of some areas of the substrate 100 that corresponds to the first contact area AR1 and the second contact area AR2 shown in FIG. 1A. FIG. 3 illustrates sectional views showing a process of forming the transistors TR.

Referring to FIG. 3, the transistors TR may be formed on the substrate 100. The step of forming the transistors TR may include a step of forming the isolation layers IS that partition active areas of the substrate 100 and a step of forming impurity areas IR of each of the transistors TR in the active areas. Before forming the impurity areas IR, as shown in FIG. 1B, the gate insulating layer GI and the gate electrode GM of each of the transistors TR may be formed on the active area of the substrate 100. The impurity areas IR may be defined by injecting at least one of an n-type impurity and a p-type impurity into the active areas that do not overlap with the gate electrode GM illustrated in FIG. 1B.

Subsequently, the first insulating layer 110 that covers the transistors TR, the first interconnections IC1 that are electrically coupled to the transistors TR, and the first bonding pads BP1 that come into contact with the first interconnections IC1 may be formed. The process of forming the first insulating layer 110, the first contacts CT1, and the first lines ML1 of the first interconnections IC1 and the first bonding pads BP1 may include a plurality of deposition processes and a plurality of etching processes.

Figure 4:
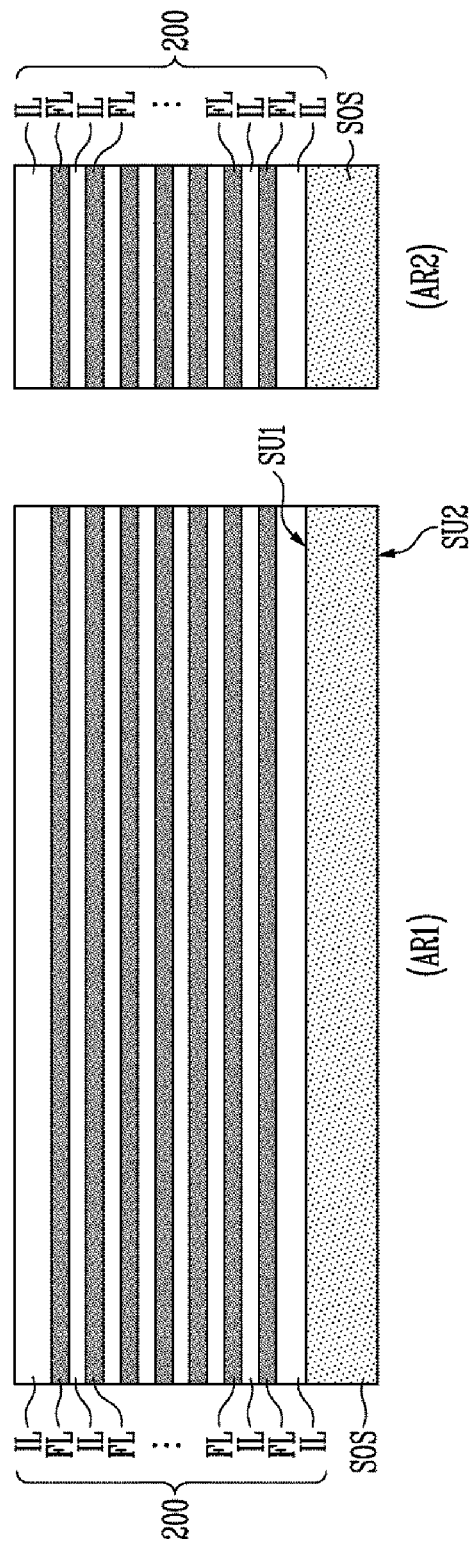

FIG. 4 illustrates sectional views of some areas of each of the source structure SOS and the stacked body 200 that correspond to the first contact area AR1 and the second contact area AR2 shown in FIG. 1A.

Referring to FIG. 4, the source structure SOS with a first surface SU1 and a second surface SU2 that face opposite directions may be provided. The source structure SOS may be a doped semiconductor.

Subsequently, a preliminary stacked body 200 may be formed on the first surface SU1 of the source structure SOS. The formation of the preliminary stacked body 200 may include the step of alternately stacking a stacked insulating layer IL and a stacked sacrificial layer FL on the first surface SU1 of the source structure SOS. The stacked insulating layer IL and the stacked sacrificial layer FL may include different materials. In an embodiment, the stacked insulating layer IL may include oxide, and the stacked sacrificial layer FL may include nitride.

Figure 5:
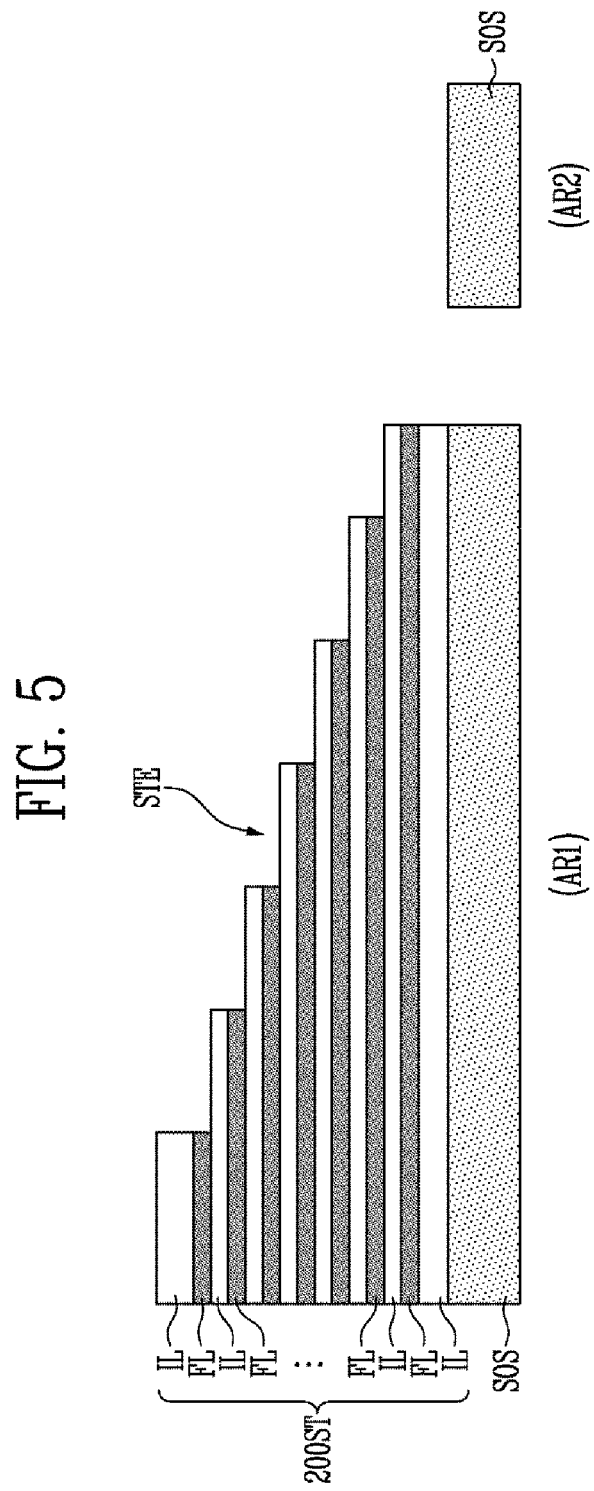
Figure 6:
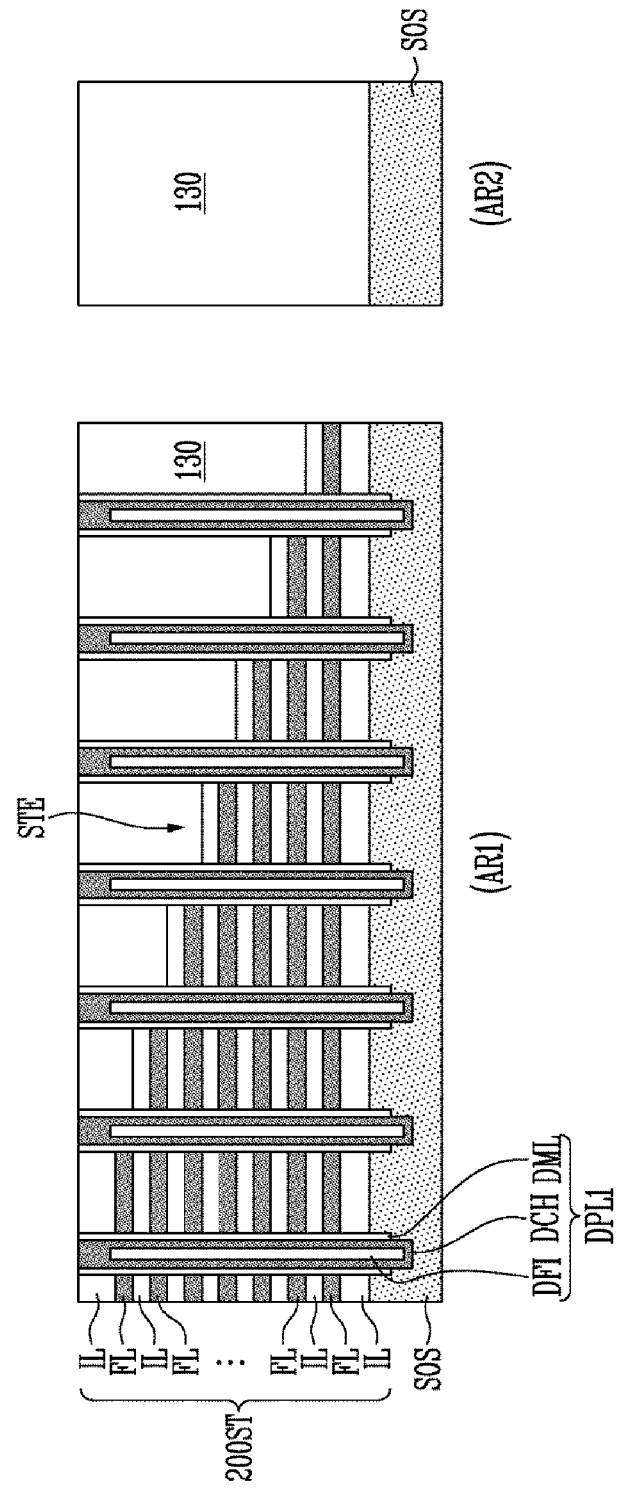

FIGS. 5 and 6 are sectional views illustrating an embodiment of a process subsequent to the formation of the preliminary stacked body 200.

Referring to FIG. 5, the stacked insulating layers IL and the stacked sacrificial layers FL of the preliminary stacked body 200 shown in FIG. 4 may be etched in a stepwise manner. Thus, a stepped stacked body 200ST with a stepped structure STE may be defined.

The stacked insulating layers IL and the stacked sacrificial layers FL may be etched to open some areas of the source structure SOS. In an embodiment, some areas of the source structure SOS that correspond to the second contact area AR2 might not overlap with the stepped stacked body 200ST, but may be exposed.

Referring to FIG. 6, the stepped stacked body 200ST and the source structure SOS may be covered with the third insulating layer 130. The third insulating layer 130 may cover the stepped structure STE of the stepped stacked body 200ST.

Subsequently, the first dummy plugs DPL1 that pass through the stepped stacked body 200ST may be formed. The first dummy plugs DPL1 may be formed simultaneously with the cell plugs CPL and the second dummy plugs DPL2 illustrated in FIGS. 1A and 1B.

The formation of the first dummy plugs DPL1, the cell plugs CPL, and the second dummy plugs DPL2 may include the formation of the plug holes that pass through the stepped stacked body 200ST, the formation of the dummy memory layer DML or the cell memory layer CML of FIG. 1B in each plug hole, and the formation of the dummy channel layer DCH and the cell channel layer CCH shown in FIG. 1B. The formation of the dummy channel layer DCH and the cell channel layer CCH may include the formation of the channel layer that is in contact with the source structure SOS and that extends along the dummy memory layer DML and the cell memory layer CML as shown in FIG. 1B and the filling of a upper end of a central area of each of the plug holes that is opened by the channel layer with the doped semiconductor pattern. Before filling the upper end of the central area of each of the plug holes with the doped semiconductor pattern, a portion of the central area of each of the plug holes may be filled with the dummy filling layers DFI or the cell filling layers CFI shown in FIG. 1B. The doped semiconductor pattern may be formed on the dummy filling layers DFI or the cell filling layers CFI shown in FIG. 1B.

Figure 7A:
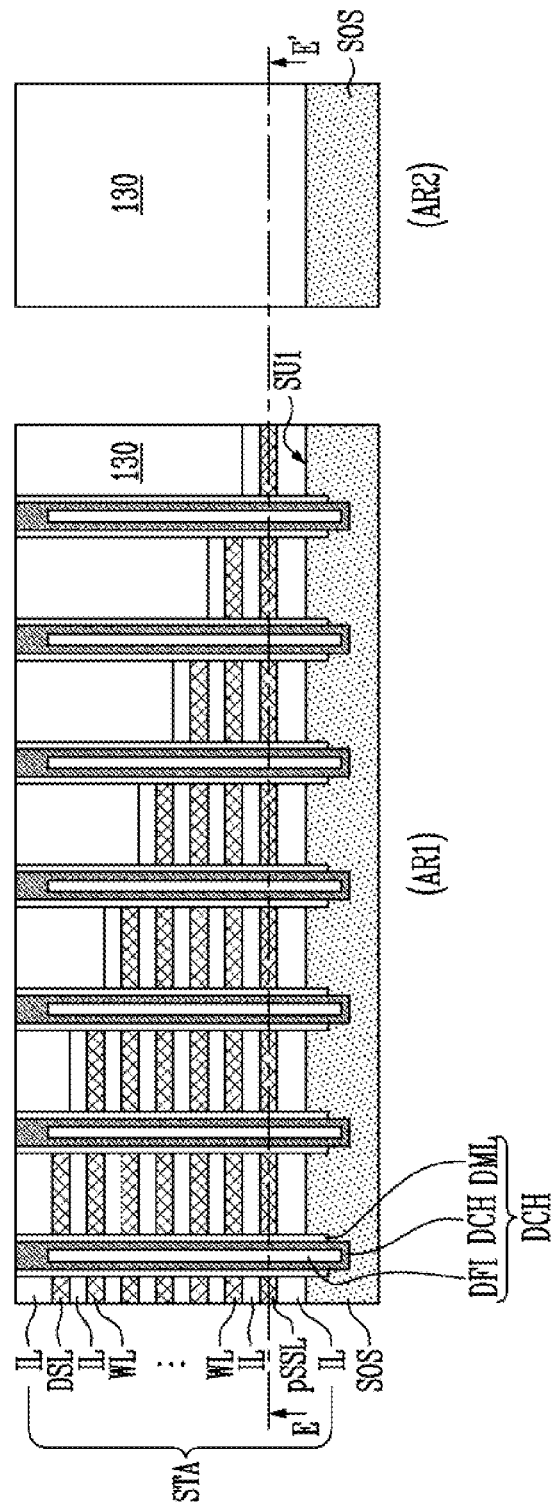

FIG. 7A is a sectional view illustrating an embodiment of a process of forming gate stacked bodies STA. FIG. 7B is a plan view taken along line E-E' of FIG. 7A.

Referring to FIGS. 7A and 7B, a first trench ST1, a second trench ST2, and third trenches ST3, passing through the stepped stacked body 200ST, illustrated in FIG. 6, may be formed. Each of the first trench ST1, the second trench ST2, and the third trenches ST3 may extend in the first direction D1. The stepped stacked body 200ST may be separated into preliminary gate stacked bodies due to the third trenches ST3. The third trenches ST3 may be arranged to be spaced apart from each other in the second direction D2. The first trench ST1 and the second trench ST2 may be disposed between the third trenches ST3. The first trench ST1 and the second trench ST2 may be spaced apart from each other in the first direction D1.

Subsequently, the stacked sacrificial layers FL, shown in FIG. 6, may be removed through the first trench ST1, the second trench ST2, and the third trenches ST3. Thereafter, empty spaces from which the stacked sacrificial layers FL are removed may be filled with the conductive material. The conductive material in each of the first trench ST1, the second trench ST2, and the third trenches ST3 may be removed through the etching process. Thereafter, the drain separation insulating structure DSS, shown in FIGS. 1A and 2D, may be formed. Thus, the conductive material may be separated into a preliminary select conductive layer pSSL and the stacked conductive layers WL and DSL, and may define the gate stacked bodies STA. Each of the gate stacked bodies STA may surround the cell plugs CPL, the first dummy plugs DPL1, and the second dummy plugs DPL2.

The preliminary select conductive layer pSSL and the stacked conductive layers WL and DSL may be alternately disposed on the stacked insulating layers IL and the first surface SU1 of the source structure SOS. The preliminary select conductive layer pSSL and the stacked conductive layers WL and DSL may be insulated from each other due to the stacked insulating layers IL. The preliminary select conductive layer pSSL may be insulated from the source structure SOS due to the stacked insulating layers IL between the stacked conductive layers WL and DSL and the source structure SOS.

The preliminary select conductive layer pSSL may be disposed between the source structure SOS and a structure that is formed by alternately stacking the stacked insulating layers IL and the stacked conductive layers WL and DSL. The preliminary select conductive layer pSSL may be formed to extend farther than the stacked conductive layers WL and DSL in the first direction D1 that is parallel to the first surface SU1 of the source structure SOS.

The preliminary select conductive layer pSSL may include a first select extension SEP1, a second select extension SEP2, and a select connector SCP. Each of the first select extension SEP1 and the second select extension SEP2 may have the shape of a plate that extends in the first direction D1 and the second direction D2. The first select extension SEP1 may be spaced apart from the second select extension SEP2 in the second direction D2 due to the first trench ST1 and the second trench ST2. The select connector SCP may be disposed between the first select extension SEP1 and the second select extension SEP2. The select connector SCP may extend from the first select extension SEP1 in the second direction D2 to be coupled to the second select extension SEP2. In other words, the first select extension SEP1 and the second select extension SEP2 may be coupled to each other through the select connector SCP between the first select extension SEP1 and the second select extension SEP2.

The stacked conductive layers WL and DSL may include drain select lines DSL and word lines WL.

Each of the word lines WL may include a first conductive extension CEP1, a second conductive extension CEP2, and a conductive connector CCP as described with reference to FIG. 2C. In the process shown in FIGS. 7A and 7B, the first conductive extension CEP1 shown in FIG. 2C may overlap with the first select extension SEP1, the second conductive extension CEP2 shown in FIG. 2C may overlap with the second select extension SEP2, and the conductive connector CCP shown in FIG. 2C may overlap with the select connector SCP.

The first trench ST1, the second trench ST2, and the third trenches ST3 may be filled with the first slit structure SLS1, the second slit structure SLS2, and the third slit structures SLS3, respectively. The first select extension SEP1, the second select extension SEP2, and the select connector SCP of the preliminary select conductive layer pSSL may be disposed between the third slit structures SLS3. The first slit structure SLS1 and the second slit structure SLS2 may be disposed between the first select extension SEP1 and the second select extension SEP2. The first slit structure SLS1 and the second slit structure SLS2 may be spaced apart from each other due to the select connector SCP.

Figure 8:
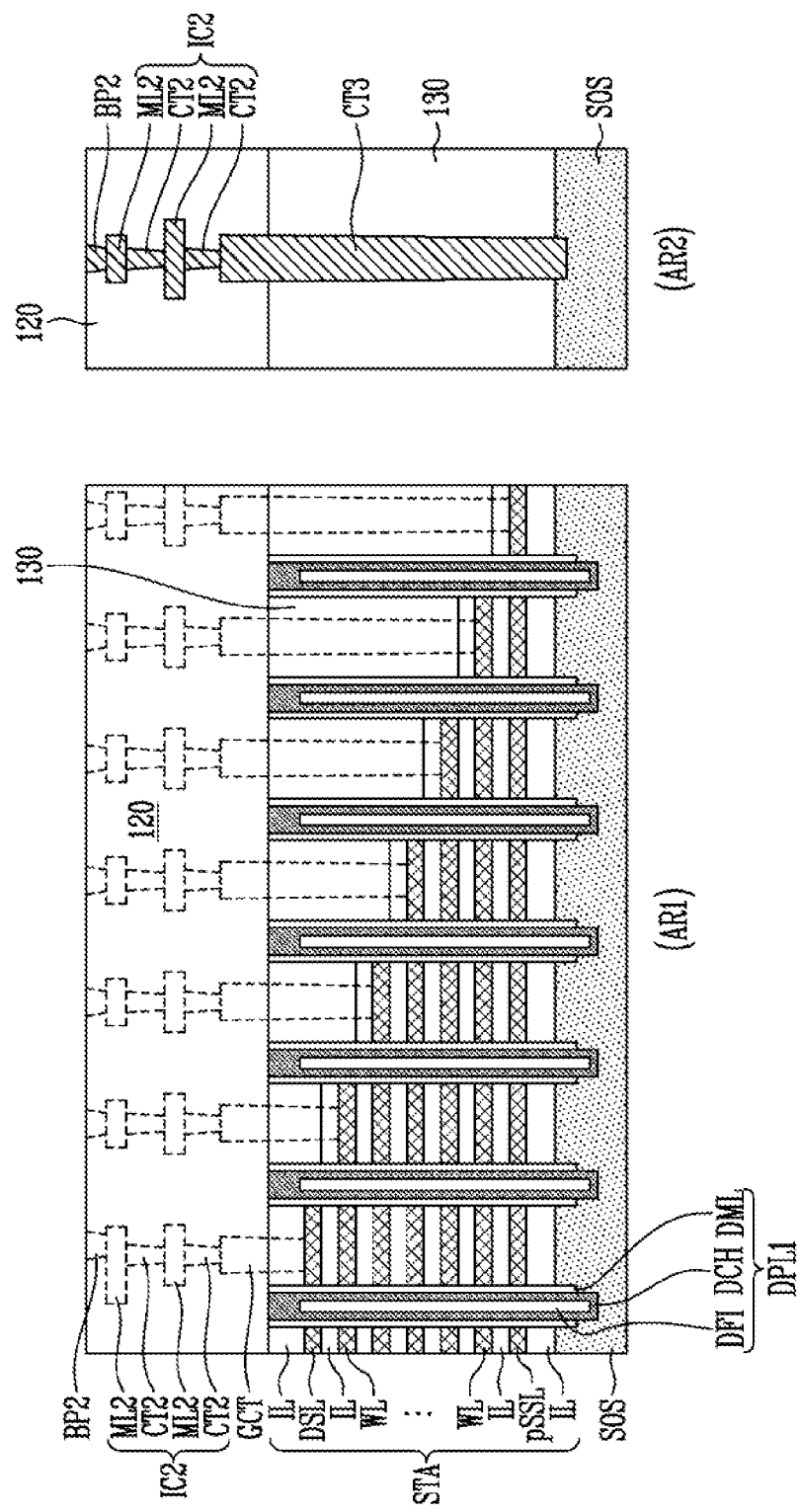

FIG. 8 is a sectional view illustrating an embodiment of subsequent processes after forming the gate stacked bodies STA.

Referring to FIG. 8, the second insulating layer 120 may be formed to cover the gate stacked bodies STA and the third insulating layer 130. The second insulating layer 120 may include two or more insulating layers.

The gate contacts GCT, the second contacts CT2 and the second lines ML2 of the second interconnections IC2, the third contact CT3, and the second bonding pads BP2 may be embedded into the second insulating layer 120 through various processes.

The gate contacts GCT may pass through the third insulating layer 130 to come into contact with the stacked conductive layers WL and DSL of each of the gate stacked bodies STA and the preliminary select conductive layer pSSL. The third contact CT3 may pass through the third insulating layer 130 to come into contact with the source structure SOS.

The bit line contact BCT and the bit line BL, shown in FIG. 1B, may be formed by using a process of forming some of the second contacts CT2 and the second lines ML2 of the second interconnections IC2.

In an embodiment, after a first lower layer of the second insulating layer 120 is formed, the gate contacts GCT and the third contact CT3 that pass through the first lower layer of the second insulating layer 120 and the third insulating layer 130 may be formed. Subsequently, after a second lower layer of the second insulating layer 120 is formed, the lowermost second contacts CT2 that come into contact with the gate contacts GCT and the third contact CT3 may be formed. The lowermost second contacts CT2 may pass through the second lower layer of the second insulating layer 120. The bit line contact BCT, shown in FIG. 1B, may pass through the second lower layer and the first lower layer of the second insulating layer 120 to come into contact with the cell channel layer CCH of the cell plug CPL as shown in FIG. 1B. Subsequently, after a third lower layer of the second insulating layer 120 is formed, the lowermost second lines ML2 that come into contact with the lowermost second contacts CT2 may be formed. The lowermost second lines ML2 may pass through the third lower layer of the second insulating layer 120. The bit line BL, shown in FIG. 1B, may pass through the third lower layer of the second insulating layer 120 to come into contact with the bit line contact BCT as shown in FIG. 1B. Thereafter, after an intermediate layer of the second insulating layer 120 is formed, the remaining second contacts CT2 and the remaining second lines ML2 that pass through the intermediate layer of the second insulating layer 120 may be formed. Subsequently, after the upper layer of the second insulating layer 120 is formed, the second bonding pads BP2 that pass through the upper layer of the second insulating layer 120 may be formed.

Figure 9:
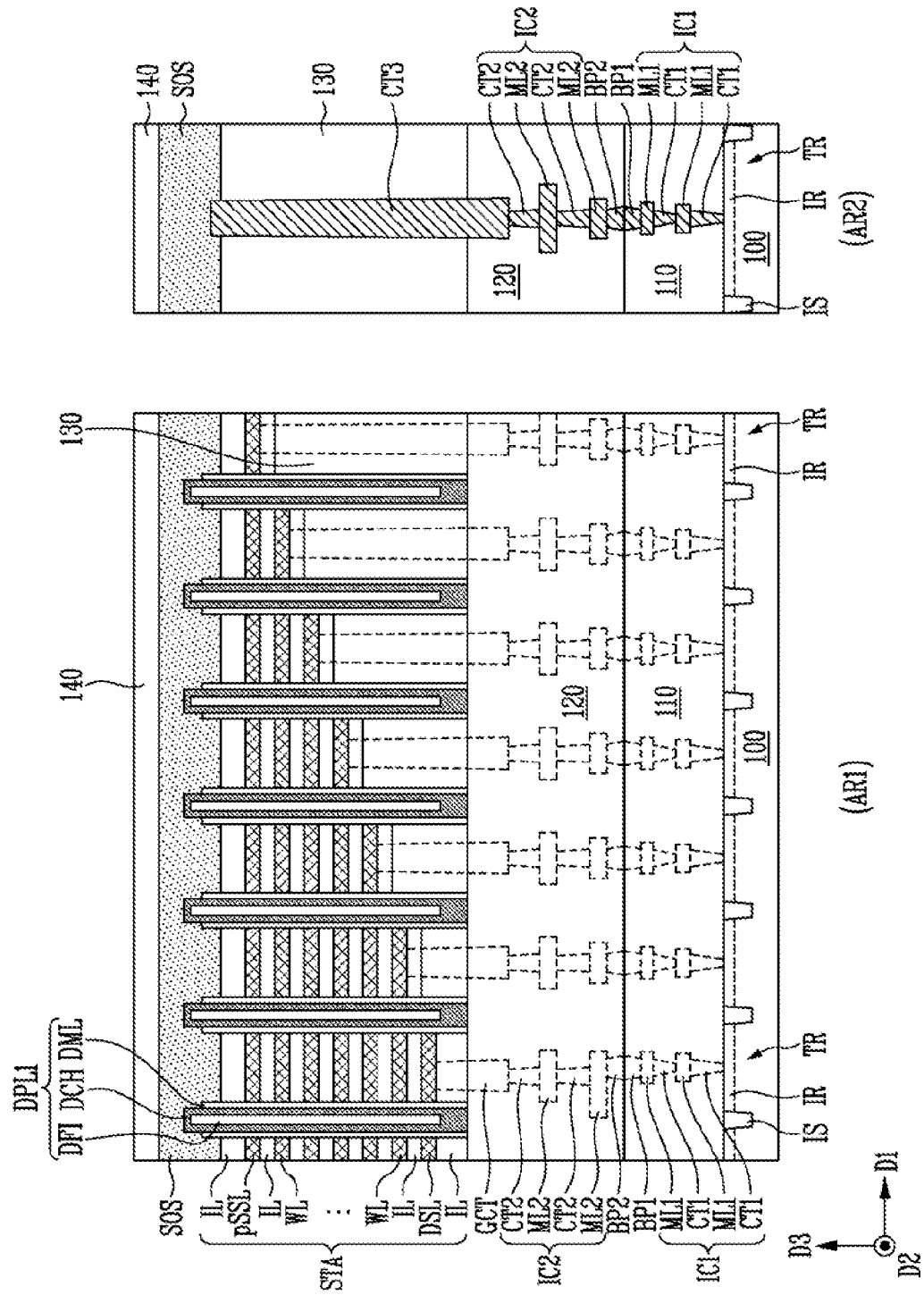

FIG. 9 illustrates an embodiment of a process of bonding a peripheral circuit structure and a memory cell array structure. The peripheral circuit structure may be provided through the processes described with reference to FIG. 3, and the memory cell array structure may be provided through the processes described with reference to FIGS. 4, 5, 6, 7A, 7B, and 8.

Referring to FIG. 9, the memory cell array structure with the gate stacked body STA may be aligned with the peripheral circuit structure with the transistors TR so that the second bonding pads BP2 face the first bonding pads BP1 in the third direction D3. Subsequently, the second bonding pads BP2 may be bonded to the first bonding pads BP1, and the second insulating layer 120 may be bonded to the first insulating layer 110.

Thereafter, the fourth insulating layer 140 may be formed to cover the source structure SOS. In an embodiment, the thickness of the source structure SOS may be reduced before the fourth insulating layer 140 is formed. The thickness of the source structure SOS may be reduced through a planarization process or an etching process. The embodiment of the present disclosure is not limited thereto, and the step of reducing the thickness of the source structure SOS may be omitted.

Figure 10A:
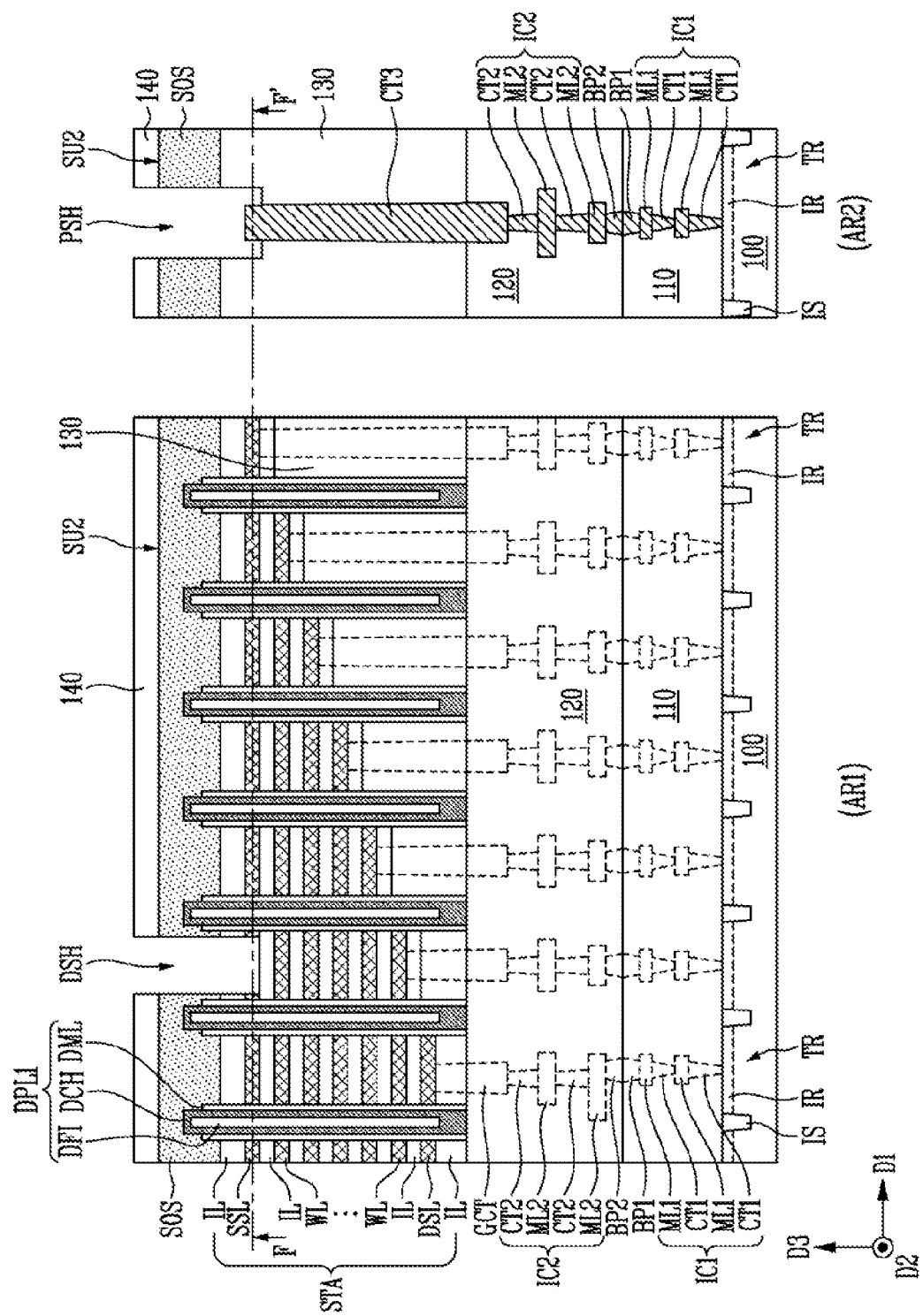
Figure 10B:
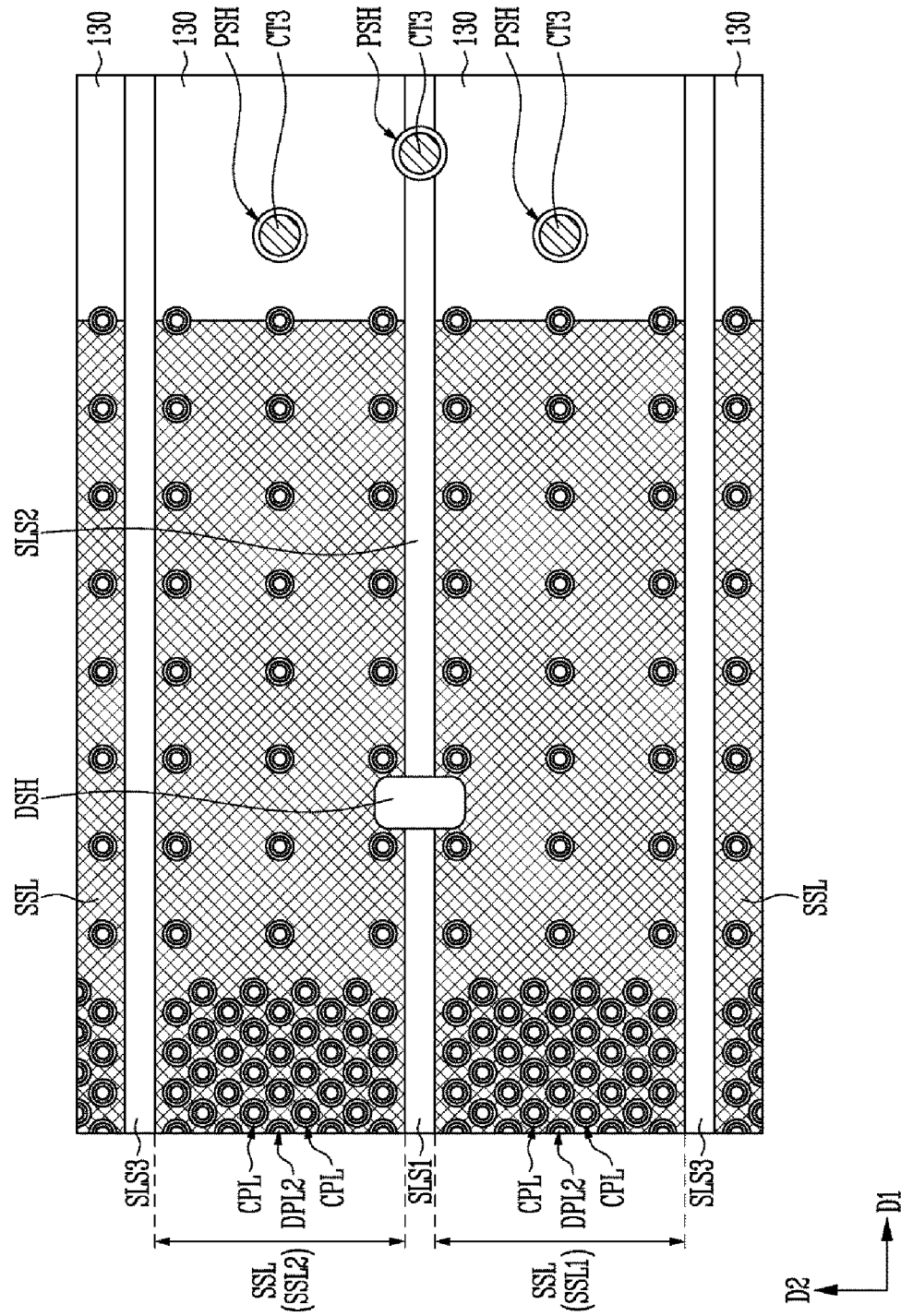

FIG. 10A is a sectional view illustrating an embodiment of a process of forming a separation structure hole DSH and a penetration structure hole PSH. FIG. 10B is a plan view taken along line F-F' shown in FIG. 10A.

Referring to FIGS. 10A and 10B, a mask pattern (not shown) with openings that correspond to the separation structure hole DSH and the penetration structure hole PSH may be formed. Subsequently, the separation structure hole DSH and the penetration structure hole PSH may be simultaneously formed through an etching process by using the mask pattern as an etching barrier. The mask pattern may be removed after the separation structure hole DSH and the penetration structure hole PSH are formed.

The separation structure hole DSH may overlap with the word lines WL. The penetration structure hole PSH may overlap with the third contact CT3. Each of the separation structure hole DSH and the penetration structure hole PSH may pass through the fourth insulating layer 140. Each of the separation structure hole DSH and the penetration structure hole PSH may pass through the source structure SOS from the second surface SU2 of the source structure SOS.

The separation structure hole DSH may pass through the stacked insulating layer IL that is adjacent to the source structure SOS. The separation structure hole DSH may pass through the select connector SCP of the preliminary select conductive layer pSSL as shown in FIGS. 7A and 7B. The separation structure hole DSH may be defined as an area that is wider than that of the select connector SCP that is illustrated in FIG. 7B. While the separation structure hole DSH is formed, the select connector SCP, illustrated in FIG. 7B, might not only be removed, but a portion of each of the first and second select extensions SEP1 and SEP2, illustrated in FIG. 7B, may also be removed. The preliminary select conductive layer pSSL, shown in FIGS. 7A and 7B, may be separated into select conductive layers SSL due to the separation structure hole DSH. In an embodiment, the preliminary select conductive layer pSSL that is between the third slit structures SLS3 may be separated into the first select conductive layer SSL1 and the second select conductive layer SSL2. The first slit structure SLS1 and the second slit structure SLS2 that are between the third slit structures SLS3 may be exposed through the separation structure hole DSH. The separation structure hole DSH may overlap with the conductive connector CCP shown in FIG. 2C.

While the separation structure hole DSH and the penetration structure hole PSH are formed, a portion of the third contact CT3 and a portion of the third insulating layer 130 may be etched. The penetration structure hole PSH may be formed to expose the third contact CT3.

As described above, even if the etching process for separating the first select conductive layer SSL1 and the second select conductive layer SSL2 from each other is not separately performed, the separation structure hole DSH may be formed while the penetration structure hole PSH is formed so that the first select conductive layer SSL1 and the second select conductive layer SSL2 may be separated from each other.

Figure 11:
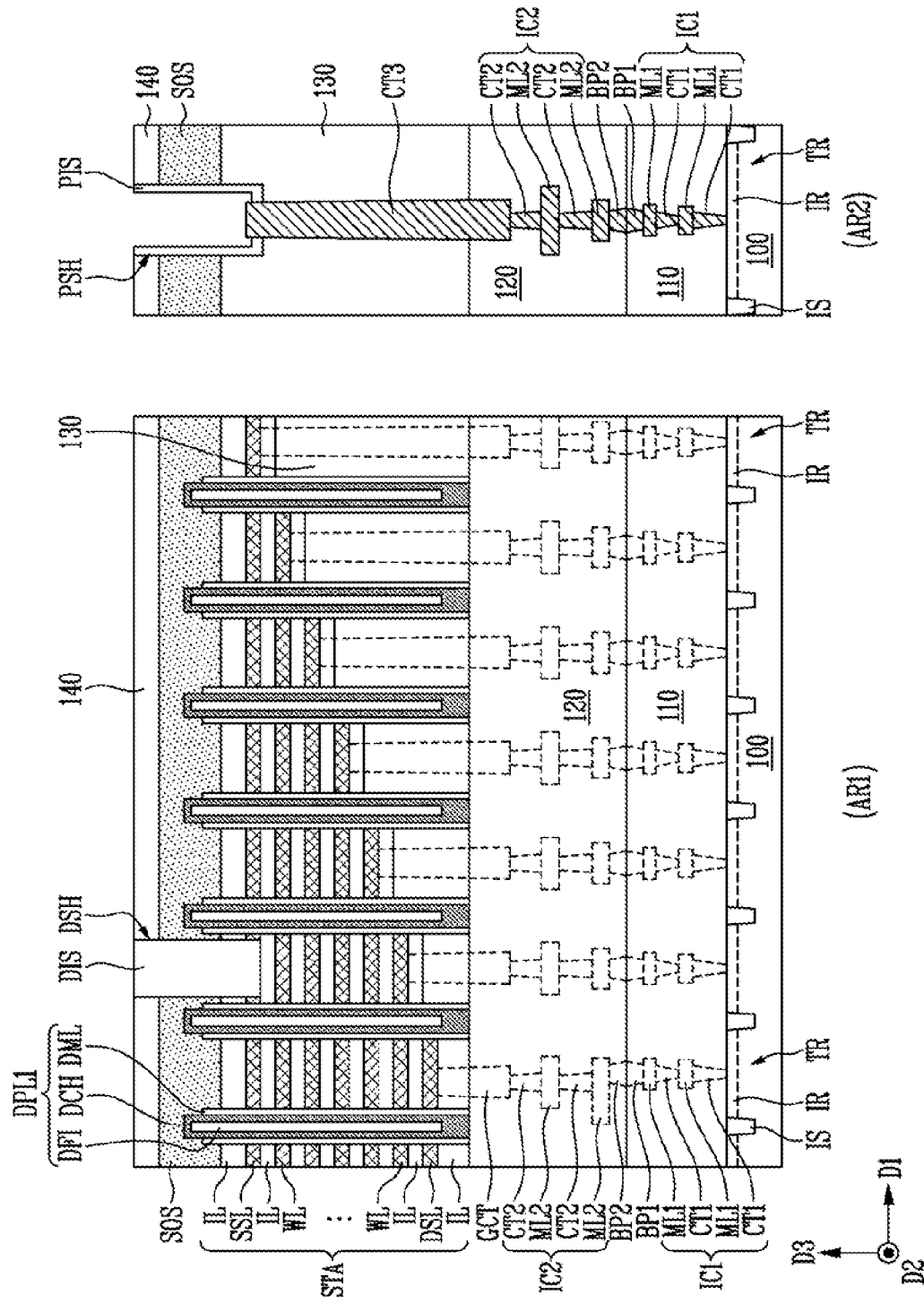

FIG. 11 is a sectional view illustrating an embodiment of a process of forming a separation insulating structure DIS and a penetration insulating structure PIS.

Referring to FIG. 11, the separation insulating structure DIS may fill the separation structure hole DSH. The penetration insulating structure PIS may extend along the sidewall of the penetration structure hole PSH to cover the sidewall of the source structure SOS. The third contact CT3 may be exposed through the bottom of the penetration structure hole PSH.

When the diameter of the penetration structure hole PSH is defined to be equal to or more than twice as large as the diameter of the separation structure hole DSH, the separation insulating structure DIS and the penetration insulating structure PIS may be simultaneously formed. In an embodiment, the formation of the separation insulating structure DIS and the penetration insulating structure PIS may include the formation of insulating material in the separation structure hole DSH and the penetration structure hole PSH, and the etching of the insulating material through an etch back process so that the third contact CT3 is exposed. Before performing the etch back process, the insulating material may completely fill the separation structure hole DSH, but might not completely fill the penetration structure hole PSH with a diameter that is greater than that of the separation structure hole DSH, and may be conformally formed along the surface of the separation structure hole DSH.

After the above-described separation insulating structure DIS and penetration insulating structure PIS are formed, as illustrated in FIG. 1C, the central area of the penetration structure hole PSH may be filled with the fourth contact CT4 of the penetration contact PCT.

Subsequently, the fifth insulating layer 150 and the top lines TML shown in FIG. 1C may be formed.

According to an embodiment of the present disclosure, before the separation insulating structure DIS is formed, some of the sacrificial layers FL, shown in FIG. 6, may be replaced with the preliminary select conductive layer pSSL as shown in FIG. 7A. Thus, the process of replacing the sacrificial layer FL with the preliminary select conductive layer pSSL may be stably performed without the interference of the separation insulating structure DIS.

Unlike the embodiment of the present disclosure, the separation insulating structure may be formed before the sacrificial layer is replaced with the preliminary select conductive layer. In this case, pattern failure of the preliminary select conductive layer may occur due to the separation insulating structure, or it may be difficult to smoothly discharge fume from the preliminary select conductive layer due to the separation insulating structure. According to an embodiment of the present disclosure, because the separation insulating structure DIS is formed after some of the sacrificial layers FL, shown in FIG. 6, are replaced with the preliminary select conductive layer pSSL, shown in FIG. 7A, the pattern failure of the preliminary select conductive layer pSSL may be reduced and the fume may be smoothly discharged.

According to an embodiment of the present disclosure, because the penetration structure hole PSH and the separation structure hole DSH may be simultaneously formed, the number of process steps may be reduced. Thus, according to an embodiment of the present disclosure, it is possible to reduce the manufacturing time and manufacturing cost of the semiconductor memory device.

Figure 12:
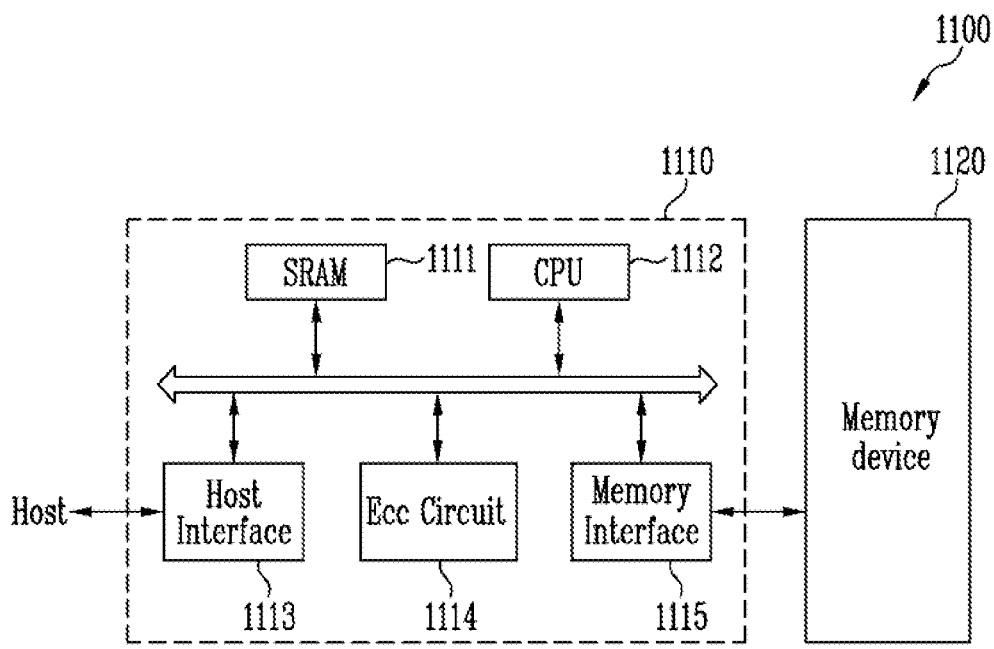
FIG. 12 is a block diagram illustrating the configuration of a memory system in accordance with an embodiment of the present disclosure.

FIG. 12 is a block diagram illustrating the configuration of a memory system in accordance with an embodiment of the present disclosure.

Referring FIG. 12, the memory system 1100 in accordance with an embodiment of the present disclosure includes a memory device 1120 and a memory controller 1110.

The memory device 1120 may include semiconductor memory devices in accordance with embodiments of the present disclosure. The memory device 1120 may be a multi-chip package formed of a plurality of flash memory chips. The memory device 1120 may include a first select conductive layer and a second select conductive layer that are disposed between a source structure and a stacked conductive layer and are spaced apart from each other. The first select conductive layer may be insulated from the second select conductive layer by a separation insulating structure. The separation insulating structure may extend to pass through the source structure.

The memory controller 1110 may control the memory device 1120, and include a static random access memory (SRAM) 1111, a central processing unit (CPU) 1112, a host interface 1113, an error correction code (ECC) circuit 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC circuit 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an integrated drive electronics (IDE) protocols.

Figure 13:
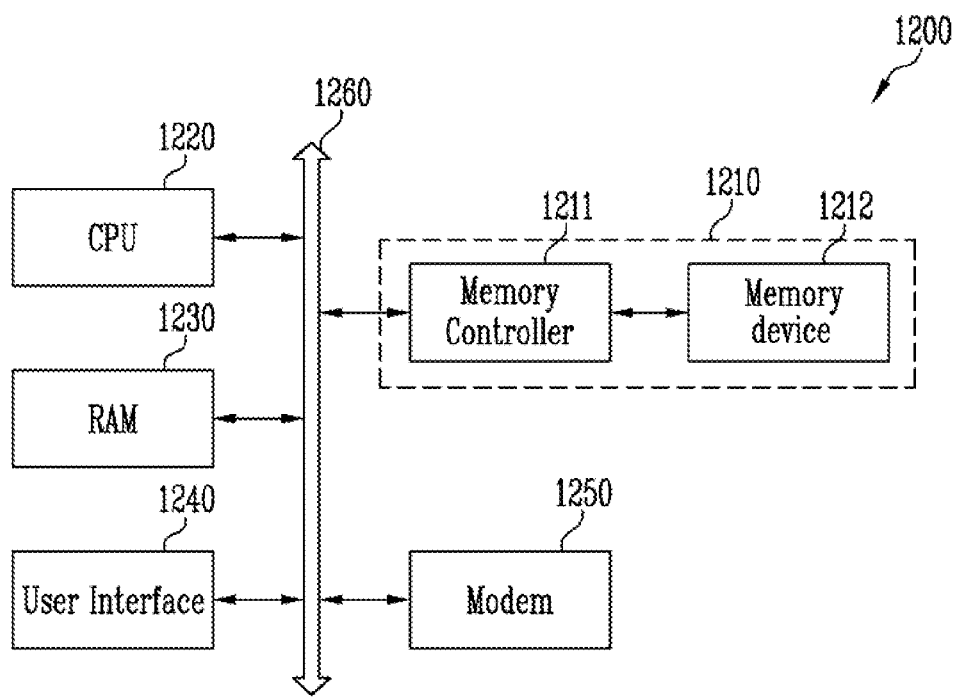
FIG. 13 is a block diagram illustrating the configuration of a computing system in accordance with an embodiment of the present disclosure.

FIG. 13 is a block diagram illustrating the configuration of a computing system in accordance with an embodiment of the present disclosure.

Referring to FIG. 13, the computing system 1200 in accordance with an embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor, a mobile DRAM and the like may be further included.

Similarly to that described above with reference to FIG. 12, the memory system 1210 may be composed of a memory device 1212 and a memory controller 1211.

According to embodiments of the present disclosure, select conductive layers may be separated from each other through a separation insulating structure that passes through a source structure. Thus, pattern failure of the select conductive layers may be reduced, and fume in the select conductive layers may be reduced. Therefore, embodiments of the present disclosure may enhance the operational reliability of a semiconductor memory device.

What is claimed is:

1. A method of manufacturing a semiconductor memory device, comprising:
    forming a source structure with a first surface and a second surface that face in opposite directions;
    forming a stacked body, including a preliminary select conductive layer, stacked conductive layers, and stacked insulating layers, on the first surface of the source structure;
    forming cell plugs that pass through the stacked body, the cell plugs being connected to the source structure;
    forming a separation structure hole that passes through the source structure from the second surface of the source structure; and
    forming a separation insulating structure in the separation structure hole,
    wherein forming the separation structure hole comprises separating the preliminary select conductive layer into a first select conductive layer and a second select conductive layer.

2. The method according to claim 1, further comprising:
    forming an insulating layer that covers the first surface of the source structure and the stacked body;
    forming a first penetration contact that passes through the insulating layer, the first penetration contact being in contact with the source structure; and
    forming a penetration structure hole that passes through the source structure from the second surface of the source structure, and
    wherein the penetration structure hole exposes the first penetration contact.

3. The method according to claim 2, wherein the penetration structure hole is formed simultaneously with the separation structure hole.

4. The method according to claim 1, further comprising:
    forming transistors;
    forming first bonding pads that are electrically coupled to the transistors, respectively;
    forming second bonding pads that are electrically coupled to the cell plugs and the stacked conductive layers, respectively; and
    bonding the second bonding pads to the first bonding pads, respectively.

5. The method according to claim 1, wherein the preliminary select conductive layer is disposed between the source structure and a structure that is formed by alternately stacking the stacked conductive layers and the stacked insulating layers, and
    wherein the preliminary select conductive layer extends farther than the stacked conductive layers in a first direction that is parallel to the first surface.

6. The method according to claim 1, wherein the preliminary select conductive layer comprises a first select extension, a second select extension, and a select connector that connects the first select extension and the second select extension.

7. The method according to claim 6, wherein:
    the stacked conductive layers comprise a word line, and
    the word line comprises a first conductive extension that overlaps with the first select extension, a second conductive extension that overlaps with the second select extension, and a conductive connector that overlaps with the select connector, the conductive connector connecting the first conductive extension and the second conductive extension.

8. The method according to claim 7, further comprising:

forming a first slit structure and a second slit structure that are disposed between the first select extension and the second select extension, the first select extension and the second select extension being spaced apart from each other due to the select connector, wherein the first slit structure and the second slit structure extend between the first conductive extension and the second conductive extension.

9. The method according to claim 8, wherein:

the separation structure hole is formed to pass through the select connector and to overlap with the conductive connector, and the first slit structure and the second slit structure are exposed through the separation structure hole.

* * * * *